(12) United States Patent
Yamazaki et al.

(10) Patent No.: US 9,411,165 B2
(45) Date of Patent: Aug. 9, 2016

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yoshiharu Hirakata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 644 days.

(21) Appl. No.: 13/875,606

(22) Filed: May 2, 2013

(65) Prior Publication Data

US 2013/0300313 A1    Nov. 14, 2013

(30) Foreign Application Priority Data

May 9, 2012    (JP) .................. 2012-107937

(51) Int. Cl.
*G05F 1/00*    (2006.01)
*G02B 27/22*    (2006.01)

(52) U.S. Cl.
CPC ...................... *G02B 27/22* (2013.01)

(58) Field of Classification Search
CPC . G02B 27/22; G02B 27/2214; G02B 27/2235
USPC .......... 315/291, 294, 297; 313/504; 345/531, 345/100, 204; 257/98; 349/117, 15, 96
See application file for complete search history.

(56) References Cited

U.S. PATENT DOCUMENTS

| 7,420,203 | B2 | 9/2008 | Tsutsui et al. |
| 7,473,923 | B2 | 1/2009 | Tsutsui et al. |
| 7,580,085 | B2 | 8/2009 | Jacobs et al. |
| 7,956,349 | B2 | 6/2011 | Tsutsui et al. |
| 7,956,353 | B2 | 6/2011 | Tsutsui et al. |
| 8,222,061 | B2 | 7/2012 | Xu et al. |
| 8,279,230 | B2 | 10/2012 | Nose et al. |
| 8,319,714 | B2 | 11/2012 | Kojima et al. |
| 2003/0189401 | A1 | 10/2003 | Kido et al. |
| 2006/0098024 | A1 | 5/2006 | Kohno |
| 2006/0138945 | A1 | 6/2006 | Wolk et al. |
| 2007/0024773 | A1 | 2/2007 | Yamada et al. |
| 2007/0176161 | A1 | 8/2007 | Seo et al. |
| 2007/0222743 | A1 | 9/2007 | Hirakata |
| 2008/0284719 | A1 | 11/2008 | Yoshida |
| 2008/0297031 | A1* | 12/2008 | Takahashi .......... C09K 11/7734 313/503 |
| 2009/0041348 | A1 | 2/2009 | Someya et al. |
| 2010/0001637 | A1 | 1/2010 | Satou |

(Continued)

FOREIGN PATENT DOCUMENTS

JP    2011-238908 A    11/2011
WO    2004/003630 A1    1/2004

*Primary Examiner* — Lincoln Donovan
*Assistant Examiner* — Thomas Skibinski
(74) *Attorney, Agent, or Firm* — Fish & Richardson P.C.

(57) ABSTRACT

A display device has an NTSC ratio of higher than or equal to 80% and a contrast ratio of higher than or equal to 500 and includes a display portion. In the display portion, pixels are provided at a resolution of greater than or equal to 80 ppi, and the pixels each includes a light-emitting module capable of emitting light with a spectral line half-width of less than or equal to 60 nm in a response time of shorter than or equal to 100 μs. Further, transient characteristics of the emission intensity of the light-emitting module have a projecting portion higher than other portions in a portion rising in response to an input signal.

18 Claims, 11 Drawing Sheets

(56) References Cited

U.S. PATENT DOCUMENTS

| | | |
|---|---|---|
| 2010/0039011 A1 | 2/2010 | Karaki et al. |
| 2010/0110728 A1 | 5/2010 | Dubrow et al. |
| 2010/0330738 A1 | 12/2010 | Uchiyama et al. |
| 2011/0127521 A1 | 6/2011 | Yamazaki |
| 2011/0157209 A1 | 6/2011 | Saito |
| 2011/0227119 A1 | 9/2011 | Tsutsui et al. |
| 2011/0227125 A1 | 9/2011 | Tsutsui et al. |
| 2011/0242420 A1 | 10/2011 | Lou |
| 2011/0254037 A1 | 10/2011 | Arasawa |
| 2011/0291088 A1 | 12/2011 | Seo et al. |
| 2011/0310134 A1 | 12/2011 | Nakatsuka |
| 2012/0001291 A1 | 1/2012 | Kokumai |
| 2012/0044216 A1 | 2/2012 | Furihata et al. |
| 2012/0099048 A1 | 4/2012 | Yamazaki et al. |
| 2012/0223346 A1 | 9/2012 | Ohsawa et al. |
| 2012/0243219 A1 | 9/2012 | Ohsawa et al. |
| 2012/0286305 A1 | 11/2012 | Sasaki et al. |
| 2013/0076775 A1 | 3/2013 | Kojima et al. |
| 2013/0083276 A1* | 4/2013 | Iwahashi ............ B41M 3/06 349/117 |
| 2013/0264549 A1* | 10/2013 | Yamazaki ............ H01L 33/50 257/40 |
| 2013/0265320 A1* | 10/2013 | Yamazaki ............ G09G 5/02 345/589 |
| 2013/0301124 A1* | 11/2013 | Yamazaki ............ G02B 27/22 359/464 |
| 2014/0152923 A1* | 6/2014 | Liu ............ G02B 27/2214 349/15 |

* cited by examiner

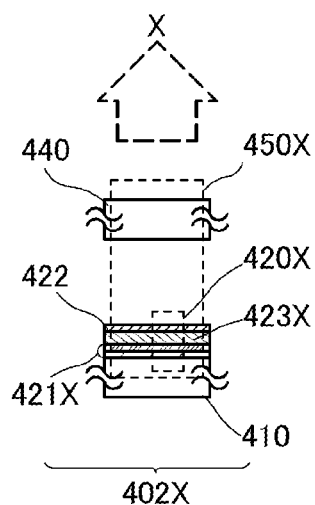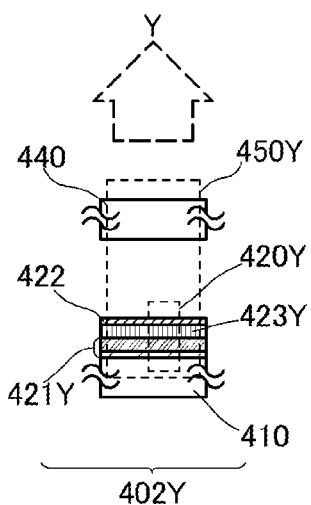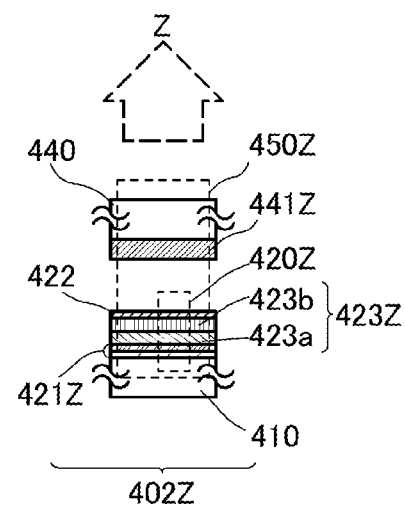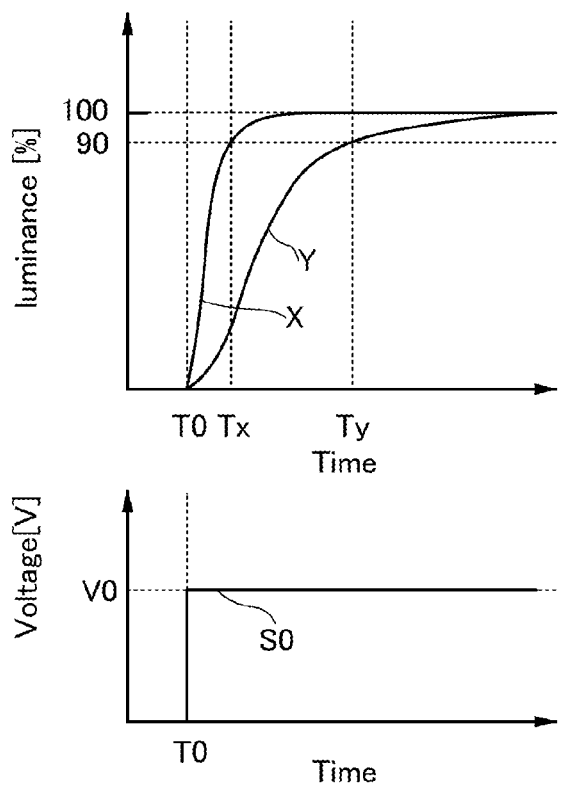

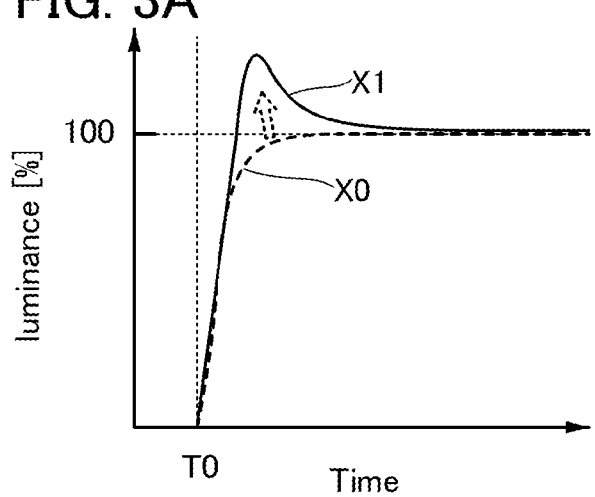
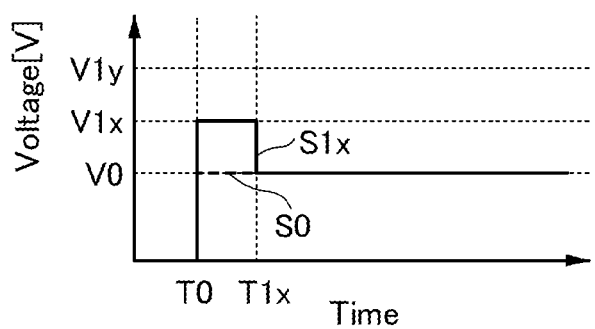
FIG. 3A
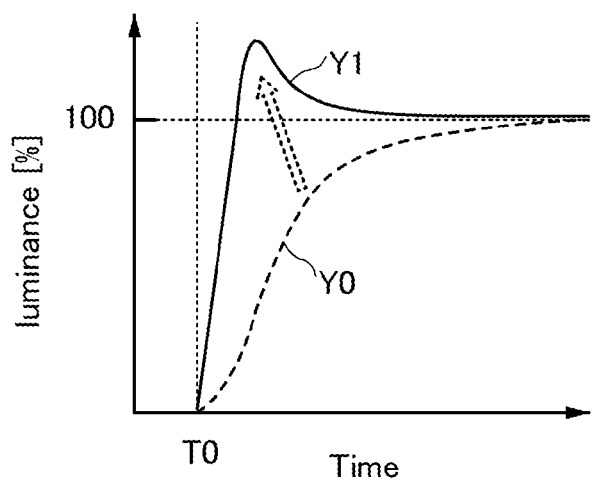
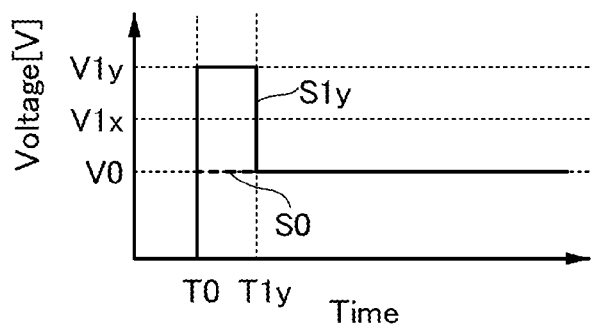
FIG. 3B

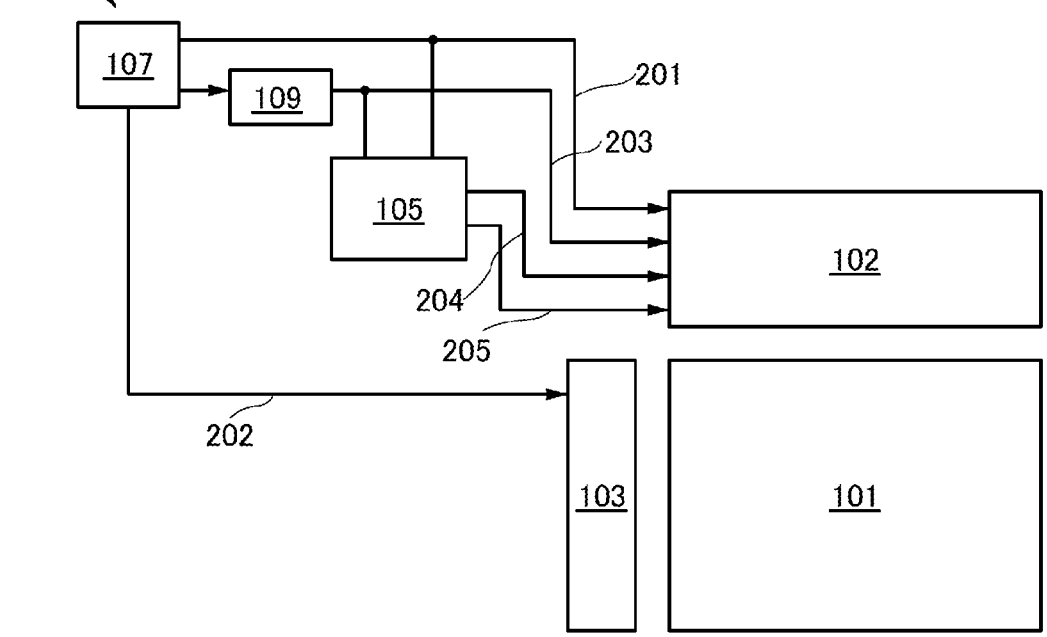

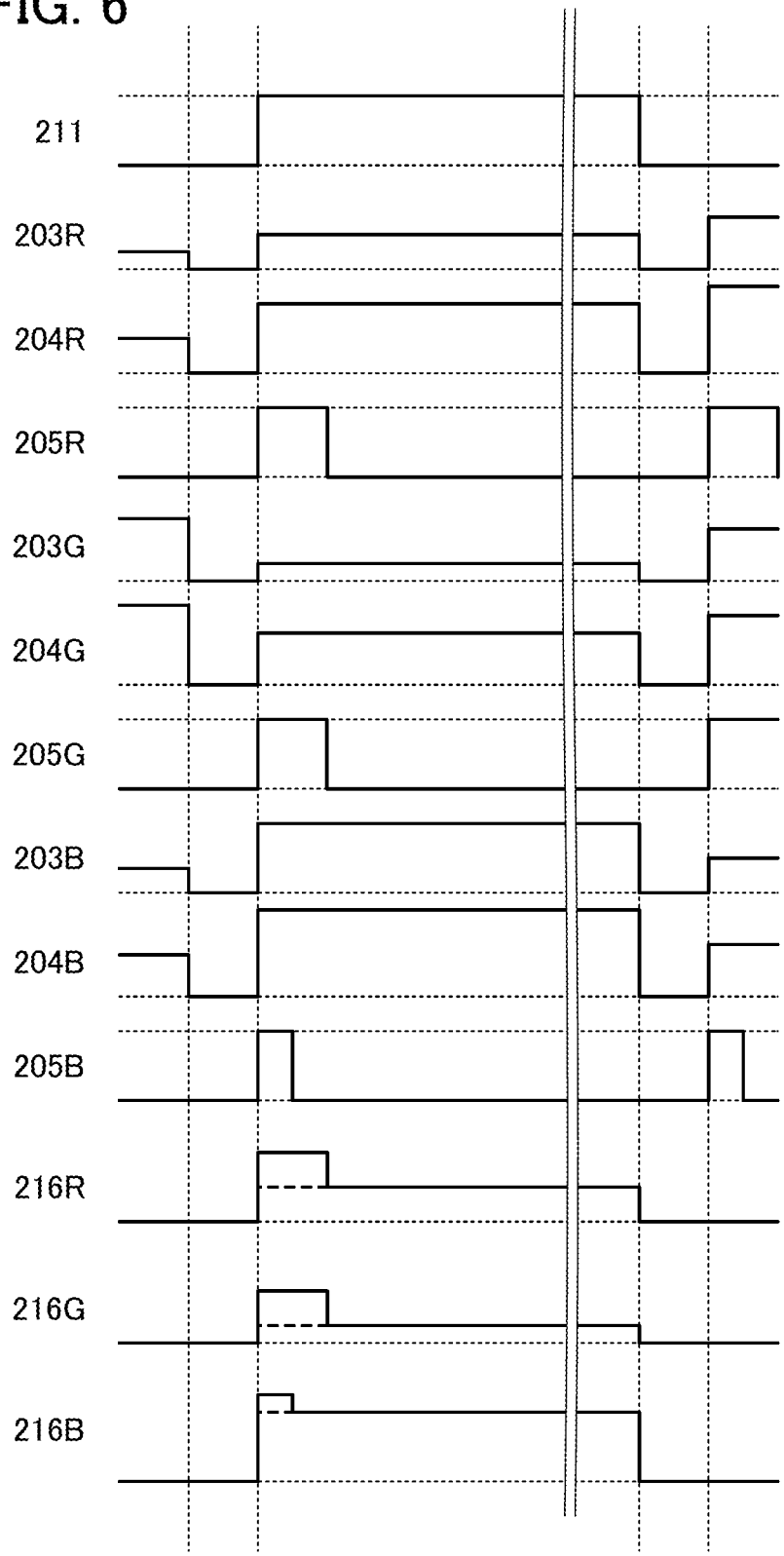

DISPLAY DEVICE AND ELECTRONIC DEVICE

BACKGROUND OF THE INVENTION

1. Field of the Invention

The present invention relates to a display device. Further, the present invention relates to an electronic device including a display device.

2. Description of the Related Art

A display device that displays a stereoscopic image using a binocular parallax is known. Such a display device is configured to display, on one screen, an image to be seen from the position of the left eye of a viewer (an image for left eye) and an image to be seen from the position of the right eye of the viewer (an image for right eye). The viewer sees the image for left eye with the left eye and the image for right eye with the right eye and is thus allowed to see a stereoscopic image.

For example, in a glasses system, an image for left eye and an image for right eye are alternately displayed on a screen of a display device in synchronization with a shutter provided in a pair of glasses, whereby the left eye of a viewer is allowed to see only the image for left eye and the right eye of the viewer is allowed to see only the image for right eye. Thus, the viewer can see a stereoscopic image.

Further, in a display device using a parallax barrier system which allows a viewer to see a stereoscopic image with naked eyes, a screen is divided into many regions (e.g., strip-like regions). These regions are alternately allocated to right eye and left eye, and a parallax barrier is provided to overlap with the boundaries of the regions. In the respective divided regions, an image for right eye and an image for left eye are displayed. With the parallax barrier, the regions for displaying the image for right eye are hidden from the left eye of a viewer and the regions for displaying the image for left eye are hidden from the right eye of the viewer; consequently, the left eye is allowed to see only the image for left eye and the right eye is allowed to see only the image for right eye. Thus, the viewer can see a stereoscopic image.

Note that a display device including a switchable parallax barrier for achieving switching between a flat image display mode and a stereoscopic image display mode is known (Patent Document 1).

In addition, a light-emitting element in which a layer containing a light-emitting organic compound is provided between a pair of electrodes is known. This light-emitting element is a self-luminous type; therefore, high contrast and high speed of response to an input signal are achieved. A display device in which this light-emitting element is used is known (Patent Document 2).

REFERENCE

Patent Document

[Patent Document 1] International Publication WO2004/003630 Pamphlet
[Patent Document 2] Japanese Published Patent Application No. 2011-238908

SUMMARY OF THE INVENTION

In the case of using a display device that displays a stereoscopic image using a binocular parallax, a distance between a screen of the display device and the left eye or the right eye of a viewer is almost uniform regardless of an image displayed. Therefore, in some cases, a distance between the viewer and a screen on which the right eye or the left eye of the viewer is focused is different from a distance, which provides a binocular parallax, between the viewer and the object in an image displayed on the screen. Thus, there has been a problem in that the difference has caused strain on the viewer.

The present invention is made in view of the foregoing technical background. Therefore, an object of one embodiment of the present invention is to provide a display device that can display an image which causes a viewer less strain associated with viewing and gives a viewer a great sense of stereoscopy and depth. Further, an object of one embodiment of the present invention is to provide an electronic device for enjoying an image which causes a viewer less strain associated with viewing and gives a viewer a great sense of stereoscopy and depth.

In order to achieve at least one of the objects, one embodiment of the present invention is made by focusing on response characteristics of a display device with respect to an image signal. Specifically, as for a display element provided in a pixel portion of the display device, the present inventors have focused the fact that transient characteristics until the completion of response to an input signal deeply influence on stereoscopic viewing. This leads to a display device having a structure exemplified in this specification and an electronic device using the same.

That is, a display device according to one embodiment of the present invention has an NTSC ratio of higher than or equal to 80% and a contrast ratio of higher than or equal to 500 and includes a display portion. In the display portion, a pixel is provided at a resolution of greater than or equal to 80 ppi, and the pixel includes a light-emitting module capable of emitting light with a spectral line half-width of less than or equal to 60 nm within a response time of shorter than or equal to 100 μs. Further, transient characteristics of the emission intensity of the light-emitting module have a projecting portion higher than other portions in a rise portion in response to an input signal.

When a viewer sees light emission having such transient characteristics in which the rise portion of the emission intensity projects, the viewer continuously sees strong light emission in an extremely short period in initial emission and weak light emission after that; such instantaneous strength and weakness in emission intensity stimulates the brain of the viewer without strain, and a more stereoscopic image can be displayed on the display portion.

Further, in the display portion included in such a display device, the distribution of light and shade in an image can be widened and thus a detailed image can be displayed. Furthermore, an image which is faithful to a camera-captured image can be displayed smoothly. Accordingly, a viewer is given a greater sense of depth by monocular vision, which can eliminate the need for displaying images including a binocular parallax on one screen. In addition, a viewer can see an image with naked eyes. As a result, it is possible to reduce strain on a viewer which is caused by viewing and to display an image which allows a viewer to have a great sense of depth.

In addition, a pixel includes light-emitting modules each emitting light with a narrow spectral line half-width and high color purity, which increases NTSC ratio and contrast. Thus, an image with a wide grayscale range can be displayed. Since the pixel includes a light-emitting element having a short response time, an image in motion can be displayed smoothly. Thus, a moving image in which a front image moves smoothly and faster than a back image while overlapping with the back image can be expressed. The wide grayscale range and the smooth motion interact with each other, which allows a viewer to see an image with a great sense of depth.

Therefore, a display device having the above structure can provide an image which gives a viewer a great sense of stereoscopy and depth without strain.

Further, a display device according to another embodiment of the present invention has an NTSC ratio of higher than or equal to 80% and a contrast ratio of higher than or equal to 500 and includes a display portion and a correction control circuit. In the display portion, a pixel is provided at a resolution of greater than or equal to 80 ppi, and the pixel includes a light-emitting module capable of emitting light with a spectral line half-width of less than or equal to 60 nm within a response time of shorter than or equal to 100 μs. Further, the correction control circuit is configured to generate a signal that corrects transient characteristics of the emission intensity of the light-emitting module and to output the signal to the display portion. Furthermore, the transient characteristics of the emission intensity of the light-emitting module have a projecting portion higher than other portions in a rise portion in response to an input signal.

Such a correction control circuit can control transient characteristics of the emission intensity of light-emitting modules. Examples of a signal generated by the correction control circuit may include a correction voltage signal that corresponds to a high voltage applied to an element right after an emission start, a correction control signal that regulates a period during which the voltage is applied to the element, and the like.

Further, in any of the above display devices according to embodiments of the present invention, the light-emitting module preferably includes a reflective film, a semi-transmissive and semi-reflective film, and a light-emitting element between the reflective film and the semi-transmissive and semi-reflective film. Further, the light-emitting element includes a pair of electrodes and a layer containing a light-emitting organic compound between the pair of electrodes.

With such a structure, as an effect of a micro resonator (also referred to as a microcavity), interference of light occurs between the reflective film and the semi-transmissive and semi-reflective film, and specific light among light with wavelengths in the visible light region is strengthened. Accordingly, high color saturation images can be displayed by light with a narrow spectral line width (specifically, a spectral line half-width of 60 nm or less), thereby giving a viewer a greater sense of depth. Consequently, it is possible to provide a display device that can display an image which causes a viewer less strain associated with viewing and gives a viewer a great sense of depth.

In any of the display devices according to embodiments of the present invention, it is preferable that the light-emitting module include the following: a reflective film; a semi-transmissive and semi-reflective film; a light-emitting element provided between the reflective film and the semi-transmissive and semi-reflective film, and including a pair of electrodes, a plurality of layers containing light-emitting organic compounds between the pair of electrodes, and an interlayer between the layers containing light-emitting organic compounds; and a color filter overlapping with the light-emitting element with the semi-transmissive and semi-reflective film provided therebetween.

With such a structure, interference of light occurs between the reflective film and the semi-transmissive and semi-reflective film, specific light among light with wavelengths in the visible light region is strengthened, and unnecessary light is absorbed by the color filter. Accordingly, high color saturation images can be displayed by light with a narrower spectral line width (specifically, a spectral line half-width of 60 nm or less), thereby giving a viewer a greater sense of depth. Consequently, it is possible to provide a display device that can display images which cause a viewer less strain associated with viewing and give a viewer a great sense of depth.

In any of the display devices according to embodiments of the present invention, it is preferable that the light-emitting module provided in each of the pixels be any one of the following: a first light-emitting module including a color filter transmitting red light and a reflective film and a semi-transmissive and semi-reflective film between which an optical path length is adjusted to i/2 times (i is a natural number) a length greater than or equal to 600 nm and less than 800 nm; a second light-emitting module including a color filter transmitting green light and a reflective film and a semi-transmissive and semi-reflective film between which an optical path length is adjusted to j/2 times (j is a natural number) a length greater than or equal to 500 nm and less than 600 nm; and a third light-emitting module including a color filter transmitting blue light and a reflective film and a semi-transmissive and semi-reflective film between which an optical path length is adjusted to k/2 times (k is a natural number) a length greater than or equal to 400 nm and less than 500 nm.

Further, in any of the display devices according to embodiments of the present invention, it is preferable that the light-emitting module provided in each of the pixels be any of the following: a first light-emitting module including a color filter transmitting red light and a reflective film and a semi-transmissive and semi-reflective film between which an optical path length is adjusted to i/2 times (i is a natural number) a length greater than or equal to 600 nm and less than 800 nm; a second light-emitting module including a color filter transmitting green light and a reflective film and a semi-transmissive and semi-reflective film between which an optical path length is adjusted to j/2 times (j is a natural number) a length greater than or equal to 500 nm and less than 600 nm; and a third light-emitting module including a color filter transmitting blue light and a reflective film and a semi-transmissive and semi-reflective film between which an optical path length is adjusted to k/2 times (k is a natural number) a length greater than or equal to 400 nm and less than 500 nm. It is also preferable that the first light-emitting module, the second light-emitting module, and the third light-emitting module include a layer containing the same light-emitting organic compound.

In any of the above-described display devices according to embodiments of the present invention, it is preferable that the light-emitting module includes a light-emitting element in which one of the pair of electrodes also serve as the reflective film and the other also serve as the semi-transmissive and semi-reflective film.

With such a structure, color purity of light emitted from each of the light-emitting module can be increased. Further, the layers containing a light-emitting organic compound can be formed in the same step. Furthermore, the pair of electrodes can also serve as the reflective film and the semi-transmissive and semi-reflective film. Therefore, a manufacturing process can be simplified. Thus, it is possible to provide a display device that is easily manufactured and that can display an image which causes a viewer less strain associated with viewing and gives a viewer a great sense of depth.

In particular, a microcavity is highly effective in narrowing the spectral line half-width and in making a pixel more unnoticeable as the resolution becomes higher. Further, it is easy for a human brain to recognize an image in motion and an image which changes from a still image to a moving image. Therefore, by increasing color purity and making a pixel more unnoticeable, a smoother moving image can be displayed; thus, it is possible to provide a display device that can display an image which causes a viewer less strain associated with viewing and gives a viewer a great sense of depth.

In any of the display devices according to embodiments of the present invention, it is preferable that the light-emitting module provided in each of the pixels emit any of the following light: red light with a spectral line half-width of less than 50 nm; green light with a spectral line half-width which is narrower than that of the red light; and blue light with a spectral line half-width which is narrower than that of the green light.

In such a structure, the half-width of the green light whose luminosity factor is higher than that of the red light is narrower than the half-width of the red light, and the half-width of the blue light is narrower than the half-width of green light. Thus, an image with high saturation can be displayed with the use of light with a narrow spectral line width (specifically, a spectral line half-width of 50 nm or less), and a depth effect is enhanced.

Another embodiment of the present invention is an electronic device including any of the above display devices.

According to one embodiment of the present invention, an image with a wide distribution of light and shade is displayed on the electronic device. Further, an image which is faithful to a camera-captured image can be displayed smoothly on the electronic device. Furthermore, an image with a great sense of stereoscopy is displayed on the electronic device. Accordingly, a viewer is given a greater sense of depth by monocular vision, which can eliminate the need for displaying images including a binocular parallax on one screen. In addition, a viewer can see an image with naked eyes. Thus, it is possible to provide an electronic device for enjoying images which cause a viewer less strain associated with viewing and give a viewer a great sense of depth.

Note that "optical path length" in this specification means the product of distance and refractive index. Therefore, the optical path length of a medium having a refractive index of more than 1 is longer than the actual distance. Note that the optical path length in a resonator of a micro resonator can be obtained by measuring optical interference. Specifically, the optical path length in a resonator can be obtained by measuring an intensity ratio of reflected light to incident light with a spectrophotometer and then plotting the measured intensity ratio with respect to a wavelength.

Note that in this specification, the display device includes any of the following modules in its category: a module in which a connector such as a flexible printed circuit (FPC) or a tape carrier package (TCP) is attached to a display panel; a module having a TCP provided with a printed wiring board at the end thereof; and a module having an integrated circuit (IC) directly mounted over a substrate, over which a display portion is formed, by a chip on glass (COG) method.

According to one embodiment of the present invention, it is possible to provide a display device that can display an image which causes a viewer less strain associated with viewing and gives a viewer a great sense of stereoscopy and depth. Further, it is possible to provide an electronic device for enjoying an image which causes a viewer less strain associated with viewing and gives a viewer a great sense of great stereoscopy and depth.

BRIEF DESCRIPTION OF THE DRAWINGS

In the accompanying drawings:

FIGS. 2A to 2D show structural examples of light-emitting modules according to embodiments and transient characteristics of emission intensity;

FIGS. 3A and 3B show transient characteristics of the emission intensity of light-emitting modules according to embodiments;

FIG. 4 shows a configuration example of a display device according to one embodiment;

FIG. 6 is a timing chart showing an operation example of a display device according to one embodiment;

DETAILED DESCRIPTION OF THE INVENTION

Figure 1A:
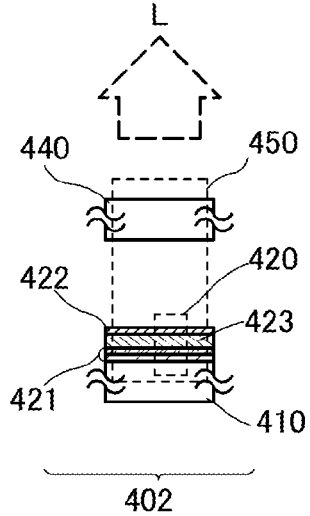
FIGS. 1A and 1B show a structural example of a light-emitting module according to one embodiment and transient characteristics of emission intensity.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

Embodiment 1

In this embodiment, a structural example of a display device according to one embodiment of the present invention is described with reference to drawings.

[Structural Example]

FIG. 1A schematically shows a structural example of a light-emitting module that can be used for a pixel portion of a display device according to one embodiment of the present invention.

In a pixel 402, a light-emitting module 450 is provided. The light-emitting module 450 includes a first substrate 410, a second substrate 440, and a light-emitting element 420 sealed between the first substrate 410 and the second substrate 440 which are bonded to each other with an unshown sealant. The light-emitting element 420 includes a first electrode 421 formed over the first substrate 410, a second electrode 422 overlapping with the first electrode 421, and a layer 423 containing a light-emitting organic compound between the first electrode 421 and the second electrode 422.

The first electrode 421 shown as an example in this embodiment includes a reflective film and a conductive film having a light-transmitting property. The conductive film having a light-transmitting property is stacked over the reflective film to be close to the second electrode 422 side. Further, the second electrode 422 has a semi-transmissive and semi-reflective property with respect to visible light. Thus, the first electrode 421 and the second electrode 422 form a micro resonator (also referred to as a microcavity).

From the light-emitting element 420 including the micro resonator, light with wavelengths in accordance with the distance between the reflective film and the semi-transmissive and semi-reflective film can be effectively extracted. Specifically, in order to extract light with a specific wavelength λ, thicknesses of the layer 423 containing a light-emitting organic compound and of the conductive film having a light-transmitting property, which is included in the first electrode 421, are preferably adjusted such that an optical path length (the product of distance and refractive index) is n times as large as λ/2 (n is a natural number).

Voltage application between the first electrode 421 and the second electrode 422 allows the light-emitting module 450 to emit light L to the outside. The light L has a narrow spectral line half-width in which light with a specific wavelength is effectively extracted.

Figure 1B:
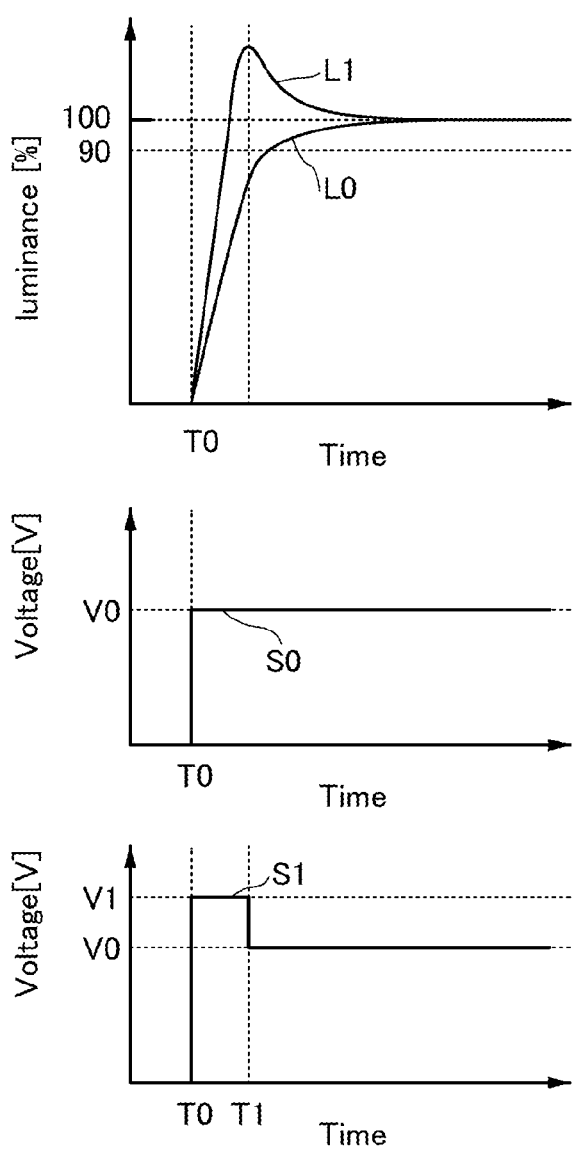

Referring to FIG. 1B, the following shows relations between voltage waveforms of signals input to the light-emitting module 450 and transient characteristics of the emission intensity of the light-emitting module 450. An upper row in FIG. 1B shows transient characteristics of the emission intensity of the light-emitting module 450, and a middle row and a lower row in FIG. 1B show voltage waveforms of signals input to the light-emitting module 450.

When a signal S0 with a rectangular wave with a rise at a time T0, as shown in the middle row in FIG. 1B, is input to the light-emitting module 450, emission intensity L0 of the light-emitting module 450 is gradually raised until it reaches a desired luminance (100%).

Here, when a signal S1 with a voltage waveform such that the voltage becomes a voltage V1 which is higher than a voltage V0 corresponding to the desired luminance in a period (T0 to T1) right after an emission start, as shown in the lower row in FIG. 1B, is input to the light-emitting module 450, emission intensity L1 of the light-emitting module 450 can be made to have a projecting portion higher than the other portions in a rise portion of transient characteristics of the emission intensity.

When a viewer sees light emission having such transient characteristics in which the rise portion of the emission intensity projects, the viewer continuously sees strong light emission in an extremely short period in initial emission and weak light emission after that; such instantaneous strength and weakness in emission intensity stimulates the brain of the viewer without strain, and a more stereoscopic image can be displayed on the display portion.

Further, such a light-emitting module can be provided in a pixel, and such a pixel can be provided at a resolution of greater than or equal to 80 ppi, preferably greater than or equal to 300 ppi, in a display portion of a display device with an NTSC ratio of higher than or equal to 80%, preferably higher than or equal to 95%, and a contrast ratio of higher than or equal to 500, preferably higher than or equal to 2000. Thus, it is possible to provide a display device that can display an image which causes a viewer less strain associated with viewing and gives a viewer a great sense of depth. Further, interference of light emitted from the light-emitting element occurs between the reflective film and the semi-transmissive and semi-reflective film, and specific light is strengthened. Thus, an image with high saturation can be displayed by light with a narrow spectral line width, and a depth effect is enhanced.

Therefore, a display device having the above structure can provide an image which gives a viewer a great sense of stereoscopy and depth without strain.

The above is the description of this structural example.

[Light-Emitting Module]

The following shows a more specific structural example of a light-emitting module that can be used for a pixel portion of a display device according to one embodiment of the present invention.

(Light-Emitting Module 450X)

In a pixel 402X shown in FIG. 2A, a light-emitting module 450X is provided. The light-emitting module 450X includes the first substrate 410, the second substrate 440, and a light-emitting element 420X sealed between the first substrate 410 and the second substrate 440 which are bonded to each other with an unshown sealant. The light-emitting element 420X includes a first electrode 421X formed over the first substrate 410, the second electrode 422 overlapping with the first electrode 421X, and a layer 423X containing a light-emitting organic compound between the first electrode 421X and the second electrode 422.

The layer 423X containing a light-emitting organic compound contains a fluorescent organic compound, and the light-emitting module 450X emits light X to the outside. The light X has a narrow spectral line half-width in which light with a specific wavelength is effectively extracted from light emitted from the fluorescent organic compound.

The light-emitting module 450X contains a fluorescent organic compound in the layer 423X containing a light-emitting organic compound. Since excitation lifetime of an excited species of the fluorescent organic compound is relatively short, a response time to an input signal is short.

(Light-Emitting Module 450Y)

In a pixel 402Y shown in FIG. 2B, a light-emitting module 450Y is provided. The light-emitting module 450Y includes a light-emitting element 420Y instead of the light-emitting element 420X in the light-emitting module 450X. Further, the light-emitting element 420Y includes a first electrode 421Y and a layer 423Y containing a light-emitting organic compound instead of the first electrode 421X and the layer 423X containing a light-emitting organic compound in the light-emitting element 420X.

The thickness of a conductive film having a light-transmitting property included in the first electrode 421Y is greater than that of the conductive film having a light-transmitting property included in the first electrode 421X.

Note that the layer 423Y containing a light-emitting organic compound contains a phosphorescent organic compound, and the light-emitting module 450Y emits light Y to the outside. The light Y has a narrow spectral line half-width in which light with a specific wavelength that is longer than the wavelength of the light mainly included in the light X is effectively extracted from light emitted from the phosphorescent organic compound.

The light-emitting module 450Y contains a phosphorescent organic compound in the layer 423Y containing a light-emitting organic compound. Since excitation lifetime of an excited species of the phosphorescent organic compound is relatively long, a response time to an input signal is longer than that of a fluorescent organic compound.

Further, with the use of the phosphorescent organic compound, transient characteristics of the emission intensity can have a gradual rise portion.

Here, an upper row in FIG. 2D shows transient characteristics of the emission intensity of the light-emitting modules 450X and 450Y when the signal S0 with a rectangular wave with a rise at the time T0, as shown in the lower row in FIG. 2D, is input to each of the light-emitting modules 450X and 450Y.

As shown in FIG. 2D, a response time (time until when the emission intensity reaches 90%) Tx–T0 of the light-emitting module 450X is shorter than a response time Ty–T0 of the light-emitting module 450Y. In this manner, response times differ depending on materials of light-emitting organic compounds. Besides, when thicknesses or materials of layers included in the layer containing a light-emitting organic compound differ, depending on differences of electrical characteristics or electro-optical characteristics, response times may differ.

(Light-Emitting Module 450Z)

In a pixel 402Z shown in FIG. 2C, a light-emitting module 450Z is provided. The light-emitting module 450Z includes a light-emitting element 420Z instead of the light-emitting element 420X in the light-emitting module 450X. Further, the light-emitting element 420Z includes a first electrode 421Z and a layer 423Z containing a light-emitting organic compound instead of the first electrode 421X and the layer 423X containing a light-emitting organic compound in the light-emitting element 420X. Further, the light-emitting element 420Z includes a color filter 441Z on a second electrode 422 side of the light-emitting element 420Z such that the color filter 441Z overlaps with the light-emitting element 420Z.

Note that in the layer 423Z containing a light-emitting organic compound, a layer 423a containing a light-emitting organic compound and a layer 423b containing a light-emitting organic compound are stacked, and the layer 423a containing a light-emitting organic compound and the layer 423b containing a light-emitting organic compound emit light of complementary colors. For example, a layer emitting blue light and a layer emitting yellow light are stacked with an interlayer provided therebetween. As a result, light emitted from the layer 423Z containing a light-emitting organic compound can have a wide spectrum.

Further, the first electrode 421Z and the second electrode 422 of the light-emitting module 450Z form a micro resonator, and the color filter 441Z is provided to overlap with the micro resonator. With this structure, the light-emitting module 450Z emits light Z to the outside. The light Z includes light with a specific wavelength and has a narrow spectral line half-width.

Therefore, in the light-emitting module 450Z, by adjusting the optical path length in the micro resonator and the color filter, it is possible to extract light with a narrow spectral line half-width and with various center wavelengths from the layer 423Z containing a light-emitting organic compound.

The light-emitting module 450Z may contain a fluorescent organic compound and a phosphorescent organic compound in the layer 423Z containing a light-emitting organic compound. By adjusting the optical path length in the micro resonator and the color filter, it is possible to preferentially extract light emitted from the fluorescent organic compound having a short response time to an input signal. In a similar manner, it is also possible to preferentially extract light emitted from the phosphorescent organic compound having a long response time to an input signal.

The above is the description of the light-emitting modules.

[Control of Transient Characteristics]

When light-emitting modules have different transient characteristics of the emission intensity, the transient characteristics of the emission intensity of the light-emitting modules are preferably controlled individually. In this case, signals having different voltage waveforms may be input to the respective light-emitting modules.

FIG. 3A shows changes in transient characteristics of the emission intensity when a signal S1x is input to the light-emitting module 450X having a short response time as a light-emitting module. The signal S1x has a voltage waveform in which the voltage is a voltage V1x, which is higher than the voltage V0 corresponding to the desired luminance, in a period (T0 to T1x) right after an emission start, as shown in a lower row in FIG. 3A.

With the use of the signal S1x, it is possible to obtain, from the light-emitting module 450X, light emission having transient characteristics having a projecting portion higher than the other portions in a rise portion of the emission intensity.

Further, FIG. 3B shows changes in transient characteristics of the emission intensity when a signal S1y is input to the light-emitting module 450Y having a long response time as a light-emitting module. The signal S1y has a voltage waveform in which the voltage is a voltage V1y, which is higher than the voltage V0 corresponding to the desired luminance, in a period (T0 to T1y) right after an emission start, as shown in a lower row in FIG. 3B.

Here, with the use of the voltage V1y, which is higher than the voltage V1x, in a period right after the emission start, even from the light-emitting module 450Y having a long response time, it is possible to obtain light emission having transient characteristics having a projecting portion higher than the other portions in a rise portion of the emission intensity.

In the above manner, by adjusting voltage waveforms of input signals, even when light-emitting modules have different transient characteristics of the emission intensity, it is possible to obtain light emission having substantially the same transient characteristics of the emission intensity of the light-emitting modules.

Note that as for voltage waveforms of signals input to light-emitting modules having different response times, not only the value of voltage applied in the period right after the emission start, but also the length of time during which a high voltage is applied may differ. For example, a time during which a high voltage is applied to a light-emitting module having a long response time is set to a long time. By thus adjusting the voltage and the length of time individually, it is possible to make transient characteristics from different light-emitting modules closer to each other, and to prevent change over time in the tone of images displayed on the display portion, preventing generation of a sense of incompatibility.

The above is the description of the control of the transient characteristics.

[Structural Example of Display Device]

The following shows configuration examples of a display device according to one embodiment of the present invention.

FIG. 4 shows a block diagram of a display device 100 shown in this configuration example. The display device 100 includes a display portion 101 including a plurality of pixels, a signal line driver circuit 102, a scan line driver circuit 103, a correction control circuit 105, an arithmetic unit 107, and a DA converter 109.

The arithmetic unit 107 is configured to decode a compressed or encoded signal and output a synchronization signal 201 to the signal line driver circuit 102 and a video signal which is a digital signal to the DA converter 109. Similarly, the arithmetic unit 107 is configured to output a synchronization signal 202 to the scan line driver circuit 103.

Further, the arithmetic unit 107 may have another function such as a pixel interpolation in accordance with upconverting of the resolution, frame interpolation in accordance with upconverting of the frame frequency, or an image processing such as noise removal, grayscale conversion, or tone correction.

The DA converter 109 converts the digital video signal output from the arithmetic unit 107 into an analog video signal 203 and outputs the video signal 203 to the signal line driver circuit 102.

The correction control circuit 105 generates a correction voltage signal 204 and a correction synchronization signal 205 from the synchronization signal 201 output from the arithmetic unit 107 and the video signal 203 output from the DA converter 109, and outputs the correction voltage signal 204 and the correction synchronization signal 205 to the signal line driver circuit 102.

Note that as a video signal input to the correction control circuit 105, the video signal 203 is used here, which is converted by the DA converter 109 into an analog signal; however, the digital video signal before being input to the DA converter 109 may alternatively be used to generate the correction voltage signal 204 and the correction synchronization signal 205.

The signal line driver circuit 102 and the scan line driver circuit 103 drive pixels in the display portion 101 on the basis of the synchronization signal 201, the synchronization signal 202, the video signal 203, the correction voltage signal 204, and the correction synchronization signal 205, and allows an image to be displayed on the display portion 101.

The display portion 101 can display an image which causes a viewer less strain associated with viewing and gives a viewer a great sense of depth.

Figure 5:
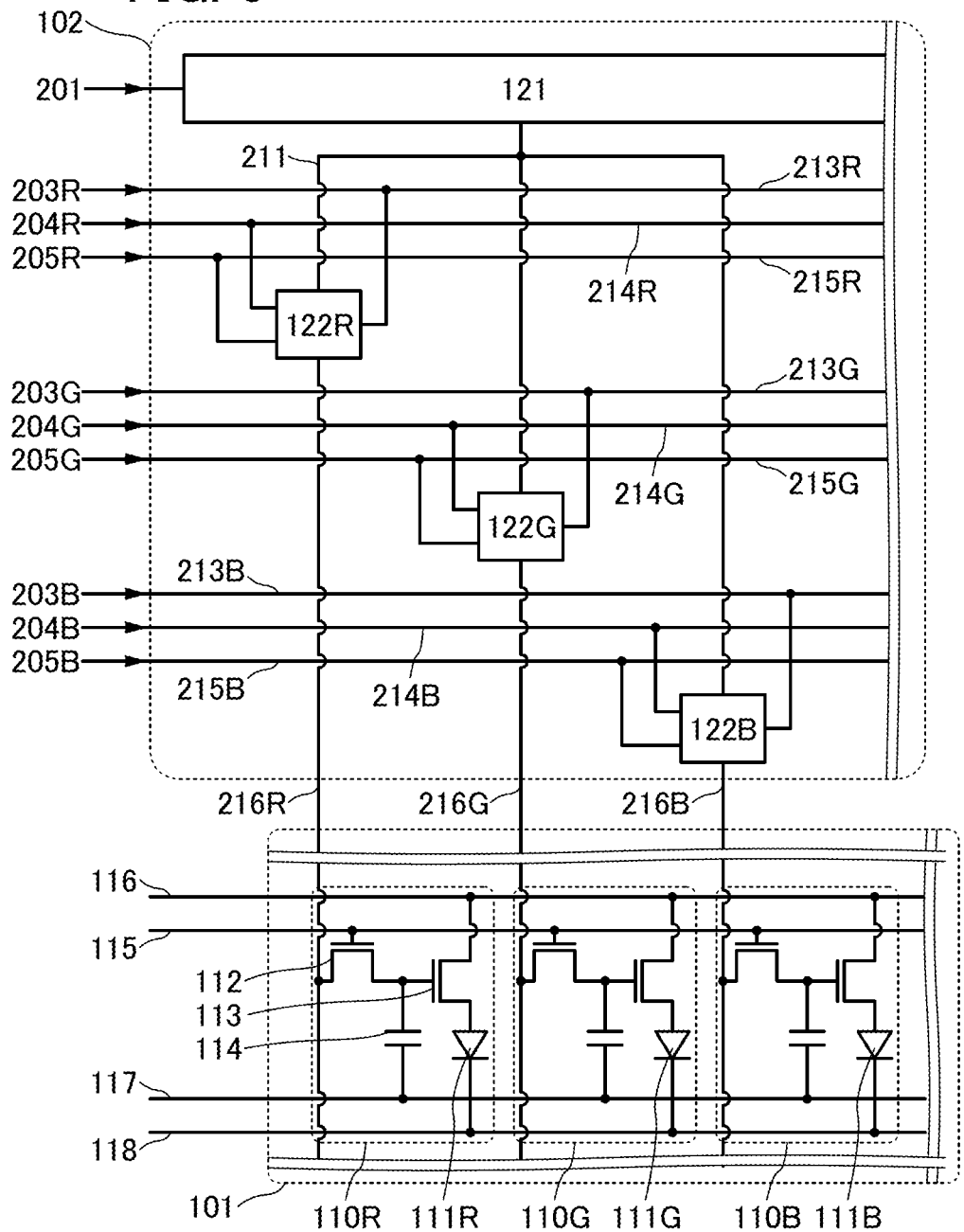
FIG. 5 shows a configuration example of a display device according to one embodiment.

Next, a configuration example of the signal line driver circuit 102 and the display portion 101 will be described in more detail. FIG. 5 shows a configuration example of the signal line driver circuit 102 and the display portion 101.

Here, one pixel including three sub-pixels is shown as the display portion 101. Each pixel includes a sub-pixel 110R including a red light-emitting element 111R, a sub-pixel 110G including a green light-emitting element 111G and a sub-pixel 110B including a blue light-emitting element 111B. Further, transient characteristics of the emission intensity of the light-emitting elements 111R, 111G, and 111B are different from one another.

Note that the description here is made by showing the light-emitting elements included in the sub-pixels emitting any of red light, green light, and blue light for simplicity; however, the light-emitting elements can be replaced by the above-described light-emitting modules.

The signal line driver circuit 102 and the display portion 101 are electrically connected to each other via a signal line 216R, a signal line 216G, and a signal line 216B. Here, the signal line 216R, the signal line 216G and the signal line 216B are electrically connected to the sub-pixel 110R, the sub-pixel 110G, and the sub-pixel 110B, respectively.

In FIG. 5, the sub-pixel 110R including the light-emitting element 111R, the sub-pixel 110G including the light-emitting element 111G and the sub-pixel 110B including the light-emitting element 111B are provided side by side. Further, each sub-pixel includes a transistor 112, a transistor 113, and a capacitor 114.

In one sub-pixel, the sub-pixel 110R for example (or the sub-pixel 110G or the sub-pixel 110B), a gate of the transistor 112 is electrically connected to a gate line 115, one of a source and a drain of the transistor 112 is electrically connected to the signal line 216R (or the signal line 216G or the signal line 216B), and the other of the source and the drain of the transistor 112 is electrically connected to one terminal of the capacitor 114 and a gate of the transistor 113. One of a source and a drain of the transistor 113 is electrically connected to a cathode line 116, and the other of the source and the drain of the transistor 113 is electrically connected to one terminal of the light-emitting element 111R (or the light-emitting element 111G or the light-emitting element 111B). The other terminal of the capacitor 114 is electrically connected to a capacitor line 117. The other terminal of the light-emitting element 111R (or the light-emitting element 111G or the light-emitting element 111B) is electrically connected to an anode line 118.

Here, to write data to the sub-pixel 110R for example, the transistor 112 is turned on by a signal input to the gate line 115, and a potential of the signal line 216R is given to a node where the gate of the transistor 113 is connected. In this case, the resistance between the source and the drain of the transistor 113 is uniquely determined by the potential given to the gate of the transistor 113. Therefore, voltage applied to the light-emitting element 111R can be varied by the potential of the signal line 216R, and the emission intensity of the light-emitting element 111R can be controlled.

Note that the structure including two transistors and one capacitor is shown here as a structure of the sub-pixel; however, for example, a circuit that corrects variations or changes in characteristics of the transistor 113 or the light-emitting element can be incorporated.

The signal line driver circuit 102 includes a latch circuit 121 and a plurality of selectors 122R, 122G, and 122B. The selectors 122R, 122G, and 122B are each electrically connected to a selection signal line 211, so that the same selection signal is input to the respective selectors from the latch circuit 121 via the selection signal line 211.

The latch circuit 121 outputs the selection signal to the selection signal line 211 on the basis of the synchronization signal 201 input from the arithmetic unit 107. Note that FIG. 5 shows only the selection signal line 211 as a selection signal line; actually, the number of selection signal lines corresponds to the number of pixels provided in the display portion 101 in the horizontal direction, and the latch circuit 121 sequentially outputs the selection signal to the selection signal lines on the basis of the synchronization signal 201.

The selector 122R is electrically connected to, not only the selection signal line 211, but also a wiring 213R to which a red video signal 203R is input, a wiring 214R to which a correction voltage signal 204R to be input to the sub-pixel 110R to correct transient characteristics of the red light-emitting element 111R is input, and a wiring 215R to which a correction synchronization signal 205R for controlling a timing of outputting the correction voltage signal 204R to the sub-pixel 110R is input.

Similarly, the selector 122G is electrically connected to a wiring 213G to which a green video signal 203G is input, a wiring 214G to which a correction voltage signal 204G is input, and a wiring 215G to which a correction synchronization signal 205G is input. Further, the selector 122B is electrically connected to a wiring 213B to which a blue video signal 203B is input, a wiring 214B to which a correction voltage signal 204B is input, and a wiring 215B to which a correction synchronization signal 205B is input.

In response to the selection signal input from the latch circuit 121 to the selector 122R, the selector 122R outputs either the video signal 203R or the correction voltage signal 204R to the signal line 216R on the basis of the correction synchronization signal 205R.

Similarly, the selector 122G outputs either the video signal 203G or the correction voltage signal 204G to the signal line 216G on the basis of the selection signal and the correction synchronization signal 205G. Further, the selector 122B outputs either the video signal 203B or the correction voltage signal 204B to the signal line 216B on the basis of the selection signal and the correction synchronization signal 205B.

Next, an operation example of the signal line driver circuit 102 will be described with reference to a timing chart shown in FIG. 6.

FIG. 6 shows changes over time in potentials of the selection signal line 211, the video signal 203R, the correction voltage signal 204R, the correction synchronization signal 205R, the video signal 203G, the correction voltage signal 204G, the correction synchronization signal 205G, the video signal 203B, the correction voltage signal 204B, the correction synchronization signal 205B, the signal line 216R, the signal line 216G, and the signal line 216B, from the top.

When a high-level potential is input from the latch circuit 121 to the selection signal line 211, the selectors 122R, 122G, and 122B output signals to the signal lines 216R, 216G, and 216B, respectively.

Here, the selector 122R outputs a correction voltage signal to the signal line 216R when the correction synchronization signal 205R is a high-level potential, and outputs the video signal 203R to the signal line 216R when the correction synchronization signal 205R is a low-level potential.

Therefore, to the signal line 216R, a potential higher than the video signal 203R is output during a period based on the correction synchronization signal 205R right after the selection start, and a potential of the video signal 203R is output after the period. By inputting such a signal to the sub-pixel 110R, light emission from a light-emitting module including the light-emitting element 111R in the sub-pixel 110R can have a projecting portion higher than the other portions in a rise portion of transient characteristics of the emission intensity.

Similarly, the selector 122G outputs, to the signal line 216G, a signal having a period during which a potential is higher than the video signal 203G right after the selection start. Further, the selector 122B outputs, to the signal line 216B, a signal having a period during which a potential is higher than the video signal 203B right after the selection start. Therefore, light emission from a light-emitting module including the light-emitting element 111G in the sub-pixel 110G and a light-emitting module including the light-emitting element 111B in the sub-pixel 110B can also have a projecting portion higher than the other portions in a rise portion of transient characteristics of the emission intensity.

When a viewer sees light emission having such transient characteristics in which the rise portion of the emission intensity projects, the viewer continuously sees strong light emission in an extremely short period in initial emission and weak light emission after that; such instantaneous strength and weakness in emission intensity stimulates the brain of the viewer without strain, and a more stereoscopic image can be displayed on the display portion.

As described above, by inputting the respective different correction voltage signals to the sub-pixels including the light-emitting elements having different transient characteristics of the emission intensity, transient characteristics of the emission intensity of the light-emitting modules in the sub-pixels can be controlled individually.

Further, as shown in FIG. 6, by inputting signals having different pulse widths as the correction synchronization signals 205R, 205G, and 205B, it is possible to make transient characteristics of the emission intensity of the sub-pixels closer to each other, and to prevent change in the tone of images displayed on the display portion 101, preventing generation of a sense of incompatibility.

When transient characteristics of the emission intensity of light-emitting elements in two or more sub-pixels are close to each other, a common correction voltage signal can be used for these sub-pixels. For example, a common correction voltage signal may be used for sub-pixels using light emission from a phosphorescent organic compound, or sub-pixels using light emission from a fluorescent organic compound. By using the common correction voltage signal, the number of wirings can be reduced and a configuration of a correction control circuit can be simplified.

When transient characteristics of the emission intensity of light-emitting elements in two or more sub-pixels are close to each other, or when two or more sub-pixels can be corrected with only a correction voltage signal, a common correction synchronization signal can be used for these sub-pixels. For example, a common correction synchronization signal may be used for sub-pixels using light emission from a phosphorescent organic compound, or sub-pixels using light emission from a fluorescent organic compound. Alternatively, the same correction synchronization signal may be used for all the sub-pixels regardless of structures of light-emitting elements. By using the common correction synchronization signal, the number of wirings can be reduced and a configuration of a correction control circuit can be simplified.

Therefore, the display device 100 having the above structure can provide an image which gives a viewer a great sense of stereoscopy and depth without strain.

The above is the description of the display device 100.

This embodiment can be combined with any of the other embodiments disclosed in this specification as appropriate.

Embodiment 2

In this embodiment, a structural example of a display device according to one embodiment of the present invention and a structural example of a display panel which can be used for the display device according to one embodiment of the present invention will be described.

[Structure of Display Panel]

Figure 7A:
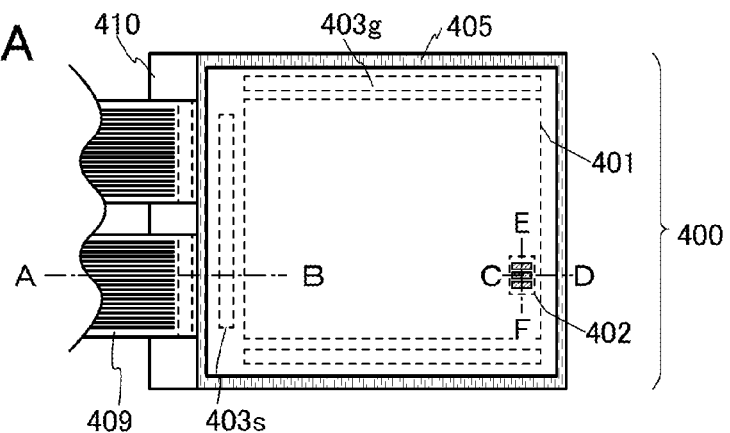
FIGS. 7A to 7C show a structural example of a display device according to one embodiment.
Figure 7B:
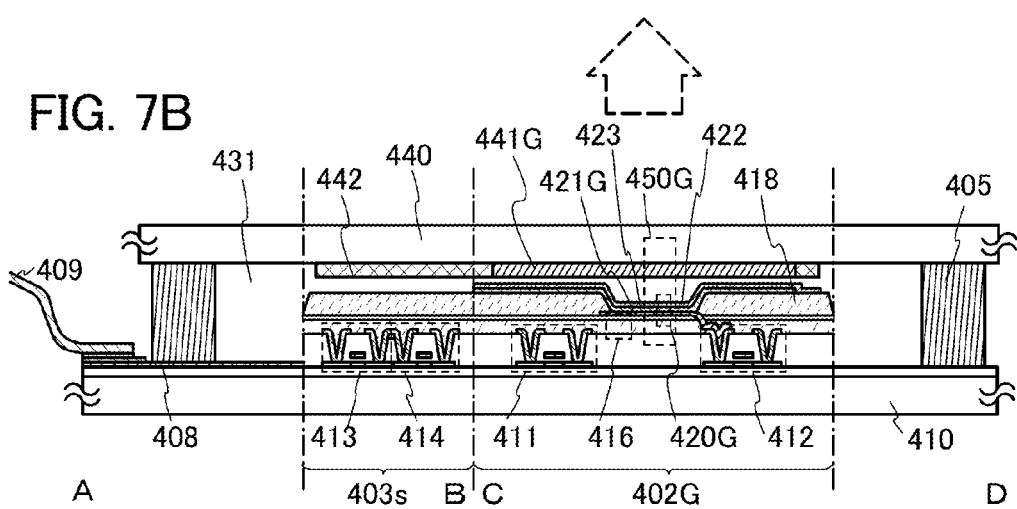
Figure 7C:
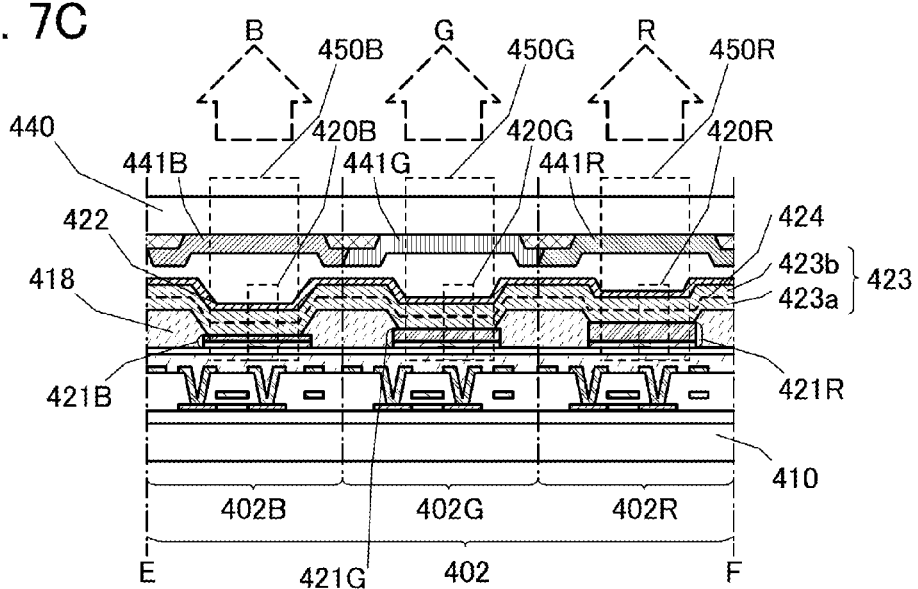

FIGS. 7A to 7C show a structure of a display panel which can be used for the display device according to one embodiment of the present invention. FIG. 7A is a top view of a structure of a display panel which can be used for the display device according to one embodiment of the present invention, FIG. 7B is a side view of a structure including a cross section taken along line A-B and C-D in FIG. 7A, and FIG. 7C is a side view of a structure of a pixel including a cross section taken along line E-F in FIG. 7A.

A display panel 400 shown as an example in this embodiment includes a display portion 401 over a first substrate 410. The display portion 401 includes a plurality of pixels 402. The pixel 402 includes a plurality of sub-pixels (e.g., three sub-pixels) (FIG. 7A). Over the first substrate 410, in addition to the display portion 401, a signal line driver circuit 403s and a scan line driver circuit 403g which drive the display portion 401 are provided. Note that the driver circuits can be provided not over the first substrate 410 but externally.

The display panel 400 includes an external input terminal and receives a video signal, a clock signal, a start signal, a reset signal, and the like from an FPC (flexible printed circuit) 409. Note that although only an FPC is illustrated here, a printed wiring board (PWB) may be attached thereto. The display panel in this specification includes not only a main body of the display panel but one with an FPC or a PWB attached thereto.

A sealant 405 bonds the first substrate 410 and a second substrate 440. The display portion 401 is sealed in a space 431 formed between the substrates (see FIG. 7B).

The structure including the cross section of the display panel 400 is described with reference to FIG. 7B. The display panel 400 includes the signal line driver circuit 403s, a sub-pixel 402G included in the pixel 402, and a lead wiring 408. Note that the display portion 401 of the display panel 400 shown as an example in this embodiment emits light in the direction denoted by the arrow in the drawing, thereby displaying images.

A CMOS circuit, which is a combination of an n-channel transistor 413 and a p-channel transistor 414, is formed for the signal line driver circuit 403s. Note that the driver circuit is not limited to this structure and may be various circuits, such as a CMOS circuit, a PMOS circuit, or an NMOS circuit.

The lead wiring 408 transmits a signal inputted from an external input terminal to the signal line driver circuit 403s and the scan line driver circuit 403g.

The sub-pixel 402G includes a switching transistor 411, a current control transistor 412, and a light-emitting module 450G. Note that an insulating layer 416 and a partition 418 are formed over the transistor 411 and the like. The light-emitting module 450G includes a reflective film, a semi-transmissive and semi-reflective film, a light-emitting element 420G between the reflective film and the semi-transmissive and semi-reflective film, and a color filter 441G provided on the semi-transmissive and semi-reflective film side through which light emitted from the light-emitting element 420G is extracted. In the light-emitting module 450G shown as an example in this embodiment, a first electrode 421G and a second electrode 422 of the light-emitting element 420G also serve as the reflective film and the semi-transmissive and semi-reflective film, respectively. Note that a direction of an image displayed in the display portion 401 is determined in accordance with a direction in which light emitted from the light-emitting element 420G is extracted.

In addition, a light-blocking film 442 is formed so as to surround the color filter 441G. The light-blocking film 442 prevents a phenomenon in which the display panel 400 reflects outside light and has an effect of increasing the contrast of images displayed in the display portion 401. Note that the color filter 441G and the light-blocking film 442 are formed on the second substrate 440.

The insulating layer 416 is a layer having insulating properties for planarizing a step due to the structure of the transistor 411 and the like or for suppressing impurity dispersion to the transistor 411 and the like. The insulating layer 416 can be a single layer or a stacked layer. The partition 418 is an insulating layer having an opening; the light-emitting element 420G is formed in the opening of the partition 418.

The light-emitting element 420G includes the first electrode 421G, the second electrode 422, and a layer 423 containing a light-emitting organic compound.

[Structural Example of Transistor]

Top-gate transistors are used in the display panel 400 shown as an example in FIG. 7A. Various types of transistors can be used for the signal line driver circuit 403s, the scan line driver circuit 403g, and the sup-pixels. Note that various semiconductors can be used for a region where channels of these transistors are formed. Specifically, as well as amorphous silicon, polysilicon, or single crystal silicon, an oxide semiconductor or the like can be used.

When an oxide semiconductor is used for a region where a channel of a transistor is formed, the transistor can be smaller than a transistor in which an amorphous silicon is used, which results in higher resolution pixels in a display portion.

When a single crystal semiconductor is used for a region where a channel of a transistor is formed, the size of the transistor can be reduced, which results in even higher resolution pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon on insulator (SOI) substrate in which a single crystal semiconductor layer is provided on an insulating surface.

An SOI substrate can be fabricated by the following method: after oxygen ions are implanted in a mirror-polished wafer, the wafer is heated at high temperatures to form an oxidized layer at a predetermined depth from a surface of the wafer and eliminate defects generated in a surface layer. Alternatively, an SOI substrate can be fabricated by the method in which the semiconductor substrate is separated by utilizing the growth of microvoids formed by hydrogen ion irradiation (this growth is caused by heat treatment). Alternatively, an SOI substrate can be fabricated by the method in which a single crystal semiconductor layer is formed on an insulating surface by crystal growth.

In this embodiment, ions are added through one surface of a single crystal semiconductor substrate, an embrittlement layer is formed at a predetermined depth from the one surface of the single crystal semiconductor substrate, and an insulating layer is formed over the one surface of the single crystal semiconductor substrate or over the first substrate 410. Next, heat treatment is performed in the state in which the single crystal semiconductor substrate provided with the embrittlement layer and the first substrate 410 are bonded to each other with the insulating layer interposed therebetween, so that a crack is generated in the embrittlement layer to separate the single crystal semiconductor substrate along the embrittlement layer. Thus, a single crystal semiconductor layer, which is separated from the single crystal semiconductor substrate, is formed as a semiconductor layer over the first substrate 410. Note that a glass substrate can be used as the first substrate 410.

Further, regions electrically insulated from each other may be formed in the semiconductor substrate so that transistors 411 and 412 may be formed using the regions electrically insulated from each other.

By forming a channel formation region using a single crystal semiconductor, variations in electrical characteristics, such as threshold voltage, between transistors due to bonding defects at grain boundaries can be reduced. Thus, in the panel according to one embodiment of the present invention, the light-emitting elements can be operated normally without placing a circuit for compensating threshold voltage in each pixel. The number of circuit elements per pixel can therefore be reduced, increasing the flexibility in layout. Thus, a high-definition display panel can be achieved. For example, a structure in which a matrix of a plurality of pixels is included, specifically 300 or more pixels per inch (i.e., the horizontal resolution is 300 or more pixels per inch (ppi)), preferably 400 or more pixels per inch (i.e., the horizontal resolution is 400 or more ppi), can be achieved.

Moreover, a transistor whose channel formation region is composed of a single crystal semiconductor can be downsized while keeping high current drive capability. The use of the downsized transistor leads to a reduction in the area of a circuit portion that does not contribute to display, which results in an increase in the display area in the display portion and a reduction in the frame size of the display panel.

[Configuration of Pixel]

A structure of the pixel 402 included in the display portion 401 is described with reference to FIG. 7C.

The pixel 402 shown as an example in this embodiment includes the sub-pixel 402G. The sub-pixel 402G includes the light-emitting element 420G; the light-emitting element 420G includes the first electrode 421G also serving as a reflective film, the second electrode 422 also serving as a semi-transmissive and semi-reflective film, a layer 423a containing a light-emitting organic compound, a layer 423b containing a light-emitting organic compound, and an interlayer 424. Further, the pixel 402 includes the color filter 441G on the second electrode 422 side so that the color filter 441G may overlap with the light-emitting element 420G, and light with a spectral line half-width of 60 nm or less and wavelengths of greater than or equal to 400 nm and less than 800 nm is emitted. Furthermore, it is possible to obtain, as light emission of the light-emitting module 450G, light emission having a projecting portion higher than the other portions in a rise portion of transient characteristics of the emission intensity in response to an input signal.

When a viewer sees light emission having such transient characteristics in which the rise portion of the emission intensity projects, the viewer continuously sees strong light emission in an extremely short period in initial emission and weak light emission after that; such instantaneous strength and weakness in emission intensity stimulates the brain of the viewer without strain, and a more stereoscopic image can be displayed on the display portion.

Such a pixel is provided in the display portion 401 at a resolution of 80 ppi or higher, preferably 300 ppi or higher, and a display device with an NTSC ratio of 80% or higher, preferably 95% or higher, and a contrast ratio of 500 or higher, preferably 2000 or higher is provided. Consequently, it is possible to provide a display device that displays an image which causes a viewer less strain associated with viewing and give a viewer a great sense of depth. In addition, interference of light emitted from the light-emitting element occurs between the reflective film and the semi-transmissive and semi-reflective film, specific light among light with a wavelength of greater than or equal to 400 nm and less than 800 nm is strengthened, and unnecessary light is absorbed by the color filter. Accordingly, high color saturation images can be displayed by light with a narrow spectral line width (specifically, a spectral line half-width of 60 nm or less), thereby giving a viewer a greater sense of depth.

Therefore, a display device having the above structure can provide an image which gives a viewer a great sense of stereoscopy and depth without strain.

In addition, the pixel 402 includes a sub-pixel 402B emitting blue light B, the sub-pixel 402G emitting green light G, and a sub-pixel 402R emitting red light R. Each sub-pixel includes a driver transistor and a light-emitting module. Each light-emitting module includes a reflective film, a semi-transmissive and semi-reflective film, and a light-emitting element between the reflective film and the semi-transmissive and semi-reflective film.

When a microresonator is formed by making an overlap between the reflective film and the semi-transmissive and semi-reflective film and a light-emitting element is formed therebetween, light with a specific wavelength can be efficiently extracted through the semi-transmissive and semi-reflective film. Specifically, the optical path length of the microresonator is n/2 times (n is a natural number) the wavelength of extracted light; thus, light extraction efficiency can be enhanced. The wavelength of extracted light depends on the distance between the reflective film and the semi-transmissive and semi-reflective film, and the distance can be adjusted by forming an optical adjustment layer between the films.

A conductive film having light-transmitting properties to visible light or a layer containing a light-emitting organic compound can be employed for a material that can be used for the optical adjustment layer. For example, the thickness of the optical adjustment layer may be adjusted using a charge generation region. Alternatively, a region containing a substance having a high hole-transport property and an acceptor substance is preferably used for the optical adjustment layer because an increase in driving voltage can be suppressed even when the optical adjustment layer is thick.

As the structure of the light-emitting element, the light-emitting element 420G is provided between the first electrode 421G also serving as a reflective film and the second electrode 422 also serving as a semi-transmissive and semi-reflective film. The light-emitting element 420G includes the layer 423a containing a light-emitting organic compound, the layer 423b containing a light-emitting organic compound, and the interlayer 424.

Note that the structural example of the light-emitting element will be described in detail in Embodiment 3.

Here, in the case of a display device using a liquid-crystal element in a pixel, the response time cannot be shortened enough because an image is displayed by physically changing the orientation of liquid crystals. In contrast, the response time of the above-described light-emitting element is faster than that of a liquid-crystal element. Thus, a display device using such a light-emitting element can display smooth moving images, in which after-images do not likely appear when displaying moving images. As a result, a display device capable of displaying more vivid and stereoscopic images and giving viewers a great sense of depth can be obtained.

The light-emitting modules shown as an example in this embodiment each have a structure in which the second electrode 422 provided in the light-emitting module also serves as a semi-transmissive and semi-reflective film. Specifically, the second electrode 422 shared by the light-emitting elements 420B, 420G and 420R also serves as a semi-transmissive and semi-reflective film of the light-emitting modules 450B, 450G, and 450R.

In addition, the light-emitting element is provided in an electrically separate manner in each light-emitting module, and the first electrode of the light-emitting element also serves as a reflective film. Specifically, a first electrode 421B provided in the light-emitting element 420B also serves as a reflective film of the light-emitting module 450B, the first electrode 421G provided in the light-emitting element 420G also serves as a reflective film of the light-emitting module 450G, and a first electrode 421R provided in the light-emitting element 420R also serves as a reflective film of the light-emitting module 450R.

The first electrode also serving as a reflective film of a light-emitting module has a stacked-layer structure in which an optical adjustment layer is stacked over the reflective film. The optical adjustment layer is preferably formed of a conductive film having light-transmitting properties with respect to visible light, and the reflective film is preferably formed of a conductive metal film having high reflectivity with respect to visible light.

The thickness of the optical adjustment layer is adjusted in accordance with a wavelength of light extracted from a light-emitting module.

For example, the first light-emitting module 450B includes a color filter 441B which transmits blue light, the first electrode 421B also serving as a reflective film, and the second electrode 422 also serving as a semi-transmissive and semi-reflective film; the optical path length between the first electrode 421B and the second electrode 422 is adjusted to k/2 times (k is a natural number) a length greater than or equal to 400 nm and less than 500 nm.

Further, the second light-emitting module 450G includes the color filter 441G which transmits green light, a reflective film, and a semi-transmissive and semi-reflective film; the optical path length between the reflective film and the semi-transmissive and semi-reflective film is adjusted to j/2 times (j is a natural number) a length greater than or equal to 500 nm and less than 600 nm.

Further, the third light-emitting module 450R includes a color filter 441R which transmits red light, a reflective film, and a semi-transmissive and semi-reflective film; the optical path length between the reflective film and the semi-transmissive and semi-reflective film is adjusted to i/2 times (i is a natural number) a length greater than or equal to 600 nm and less than 800 nm.

In such a light-emitting module, interference of light emitted from the light-emitting elements occurs between the reflective film and the semi-transmissive and semi-reflective film, light having a specific wavelength among light having a wavelength of greater than or equal to 400 nm and less than 800 nm is strengthened, and unnecessary light is absorbed by the color filter. Accordingly, high color saturation images can be displayed by light with a narrow spectral line width (specifically, a spectral line half-width of 60 nm or less), thereby giving a viewer a greater sense of depth. Consequently, it is possible to provide a display device that can display images which cause a viewer less strain associated with viewing and give a viewer a great sense of depth.

In particular, the third light-emitting module 450R emits red light with a spectral line half-width of less than 50 nm, the second light-emitting module 450G emits green light with a spectral line half-width which is narrower than that of the light emitted from the third light-emitting module 450R, and the first light-emitting module 450B emits blue light with a spectral line half-width which is narrower than that of the light emitted from the second light-emitting module 450G.

In the light-emitting module with such a structure, the half-width of the green light whose luminosity factor is higher than that of the red light is narrower than the half-width of the red light, and the half-width of the blue light is narrower than the half-width of the green light. Thus, an image with high saturation can be displayed with the use of light with a narrow spectral line width (specifically, a spectral line half-width of 50 nm or less), and a depth effect is enhanced.

Note that the first light-emitting module 450B, the second light-emitting module 450G, and the third light-emitting module 450R each include the layer 423a containing a light-emitting organic compound, the layer 423b containing a light-emitting organic compound, and the interlayer 424. In addition, one of the pair of electrodes of the light-emitting element also serves as a reflective film and the other thereof also serves as a semi-transmissive and semi-reflective film.

In the light-emitting modules with such a structure, each layer containing a light-emitting organic compound in the plurality of light-emitting modules can be formed in one process. Further, the pair of electrodes also serves as the reflective film and the semi-transmissive and semi-reflective film. Therefore, a manufacturing process can be simplified. Thus, it is possible to provide a display device that can display an image which causes a viewer less strain associated with viewing and gives a viewer a great sense of depth.

[Structure of Partition]

The partition 418 is formed to cover end portions of the first electrodes 421B, 421G, and 421R.

The partition 418 has a curved surface with curvature at a lower end portion thereof. As a material of the partition 418, negative or positive photosensitive resin can be used.

Note that using a material absorbing visible light for the partition produces an effect of suppressing light leakage into adjacent light-emitting elements (also called cross talk).

In addition, in a structure that displays images by extracting light emitted from the light-emitting module from the first substrate 410 side which is provided with a semi-transmissive and semi-reflective film, the partition formed using a material absorbing visible light absorbs outside light which is reflected by the reflective film on the first substrate 410, thereby suppressing the reflection.

[Sealing Structure]

The display panel 400 shown as an example in this embodiment has a structure in which the light-emitting element is sealed in a space enclosed by the first substrate 410, the second substrate 440, and the sealant 405.

The space can be filled with an inert gas (e.g., nitrogen or argon) or resin. An absorbent of impurity (typically, water and/or oxygen) such as a dry agent may be provided.

The sealant 405 and the second substrate 440 are desirably formed using a material which does not transmit impurities in the air (such as water and/or oxygen) as much as possible. An epoxy-based resin, glass frit, or the like can be used for the sealant 405.

Examples of the second substrate 440 include a glass substrate; a quartz substrate; a plastic substrate formed of polyvinyl fluoride (PVF), polyester, an acrylic resin, or the like; a substrate of fiberglass-reinforced plastics (FRP); and the like.

[Modification Example]

Figure 8A:
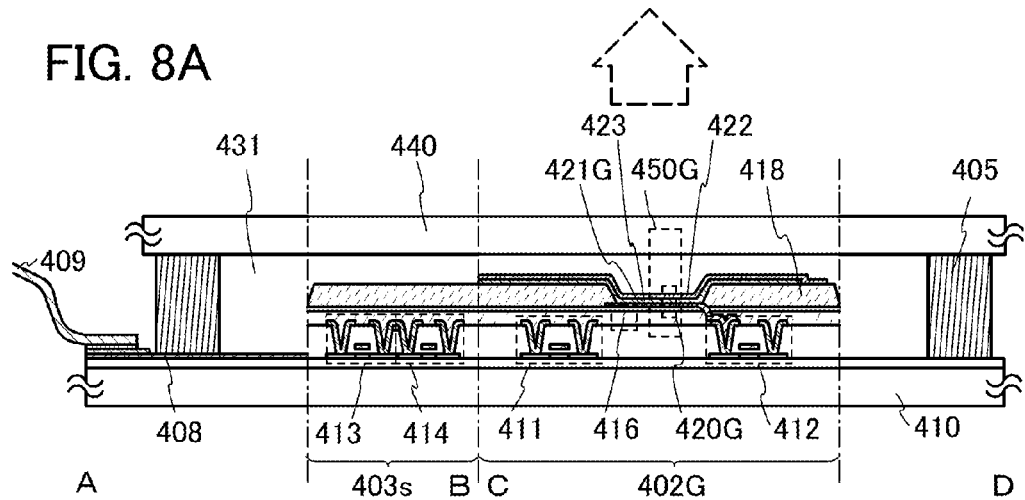
FIGS. 8A and 8B show a structural example of a display device according to one embodiment.
Figure 8B:
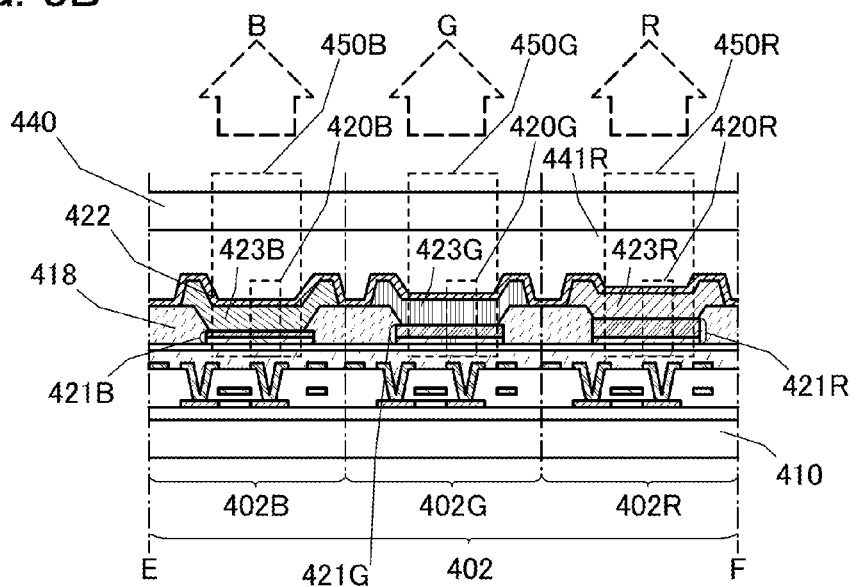

FIGS. 8A and 8B show a modification example of this embodiment. FIG. 8A is a side view of a structure including cross sections taken along line A-B and C-D in FIG. 7A, and FIG. 8B is a side view of a structure of a pixel including a cross section taken along line E-F in FIG. 7A.

A display panel shown in FIGS. 8A and 8B is a modification example of the display panel shown in FIGS. 7A to 7C and has a pixel structure different from that in the display panel shown in FIGS. 7A to 7C. Specifically, the display panel shown in FIGS. 8A and 8B is different from the display panel shown in FIGS. 7A to 7C in that the color filter is not provided and in that sub-pixels of different emission colors include layers containing different light-emitting organic compounds. A modification example of a structure of the pixel 402 included in the display portion 401 is described with reference to FIG. 8B.

The pixel 402 shown as the modification example in this embodiment includes the sub-pixel 402B emitting blue light B, the sub-pixel 402G emitting green light G, and the sub-pixel 402R emitting red light R. Each sub-pixel includes a driver transistor and a light-emitting module. Each light-emitting module includes a reflective film, a semi-transmissive and semi-reflective film, and a light-emitting element between the reflective film and the semi-transmissive and semi-reflective film.

The sub-pixel 402B includes the first electrode 421B also serving as the reflective film, the second electrode 422 also serving as the semi-transmissive and semi-reflective film, and a layer 423B containing a light-emitting organic compound that emits light including blue light. Further, the optical path length in the micro resonator is adjusted such that blue light with a spectral line half-width of less than or equal to 60 nm is emitted.

The sub-pixel 402G includes the first electrode 421G also serving as the reflective film, the second electrode 422 also serving as the semi-transmissive and semi-reflective film, and a layer 423G containing a light-emitting organic compound that emits light including green light. Further, the optical path length in the micro resonator is adjusted such that green light with a spectral line half-width of less than or equal to 60 nm is emitted.

The sub-pixel 402R includes the first electrode 421R also serving as the reflective film, the second electrode 422 also serving as the semi-transmissive and semi-reflective film, and a layer 423R containing a light-emitting organic compound that emits light including red light. Further, the optical path length in the micro resonator is adjusted such that red light with a spectral line half-width of less than or equal to 60 nm is emitted.

Further, as light emission from any one of the light-emitting module 450B, the light-emitting module 450G, and the light-emitting module 450R, it is possible to obtain light emission having a projecting portion higher than the other portions in a rise portion of transient characteristics of the emission intensity in response to an input signal.

Note that materials that can be used for the layers containing the respective light-emitting organic compounds will be described in detail in Embodiment 3.

Such a pixel is provided in the display portion 401 at a resolution of 80 ppi or higher, preferably 300 ppi or higher, and a display device with an NTSC ratio of 80% or higher, preferably 95% or higher, and a contrast ratio of 500 or higher, preferably 2000 or higher is provided. Consequently, it is possible to provide a display device that displays an image which causes a viewer less strain associated with viewing and give a viewer a great sense of depth. In addition, interference of light emitted from the light-emitting element occurs between the reflective film and the semi-transmissive and semi-reflective film, and specific light among light with a wavelength of greater than or equal to 400 nm and less than 800 nm is strengthened. Accordingly, high color saturation images can be displayed by light with a narrow spectral line width (specifically, a spectral line half-width of 60 nm or less), thereby giving a viewer a greater sense of depth.

This embodiment can be combined with any of the other embodiments disclosed in this specification as appropriate.

Embodiment 3

In this embodiment, a structure of a display panel which can be used for a display device according to one embodiment of the present invention will be described.

Figure 9A:
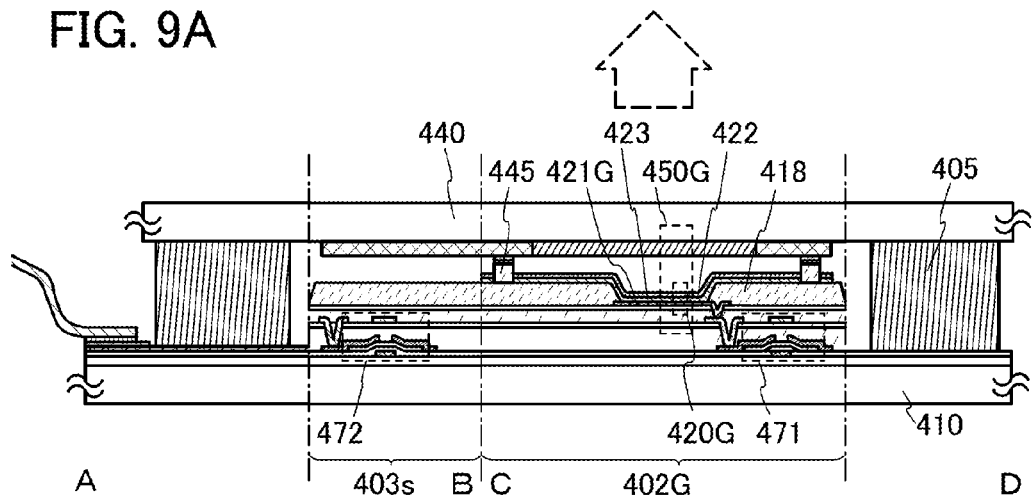
FIGS. 9A and 9B show a structural example of a display device according to one embodiment.
Figure 9B:
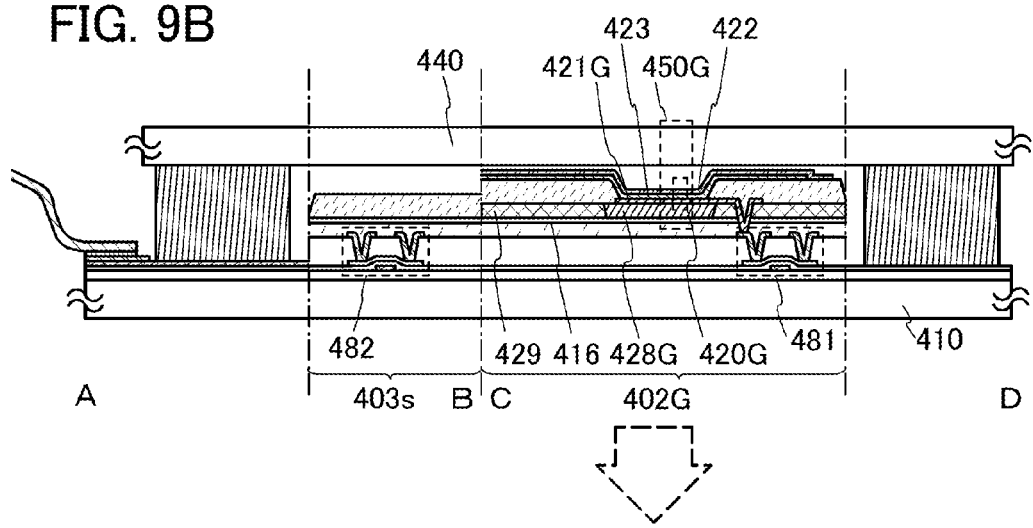

FIG. 9A is a side view of a structure including a cross section taken along line A-B and C-D in FIG. 7A, and FIG. 9B is a side view of a structure including a cross section taken along line A-B and C-D in FIG. 7A.

A display panel shown as an example in FIG. 9A or FIG. 9B has the same top surface structure as the display panel shown as an example in Embodiment 2, but has a different side surface structure from that of the display panel shown as an example in Embodiment 2. Note that portions having the same structure as those described in Embodiment 2 are denoted by the same reference numerals, and the description of Embodiment 2 is applied thereto.

[Structural Example 1 of Display Panel]

In the display panel shown as an example in FIG. 9A, a display portion including the sub-pixel 402G and the signal line driver circuit 403s are provided over the first substrate 410. A transistor 471 is provided in the sub-pixel 402G and a transistor 472 is provided in the signal line driver circuit 403s. Both of the transistors 471 and 472 are bottom-gate transistors.

A second gate electrode (also referred to as a back gate) may be provided to overlap with a semiconductor of a region in the transistor where a channel is formed. The characteristics (e.g., threshold voltage) of the transistor provided with the second gate electrode can be controlled by a potential to be given to the second gate electrode.

A pair of spacers 445 is provided over a partition 418, thereby controlling a gap between the first substrate 410 and the second substrate 440. Thus, it is possible to prevent a problem of disfigurement in which patterns (also called Newton's rings) derived from optical interference between the first substrate 410 and the second substrate 440 are observed. Further, it is possible to prevent optical crosstalk by providing the pair of spacers 445 such that light leakage from the adjacent sub-pixel is prevented.

The following will show an example of a semiconductor which is preferably used for the region in the transistor where a channel is formed, as an example in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An oxide semiconductor containing at least indium (In) or zinc (Zn) is preferably used. In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and a lanthanoid element (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, an "In—Ga—Zn-based oxide" means an oxide containing In, Ga, and Zn as its main components and there is no particular limitation on the ratio of In to Ga and Zn. The In—Ga—Zn-based oxide may contain a metal element other than the In, Ga, and Zn.

Alternatively, a material represented by $In/MO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Further alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1, In:Ga:Zn=3:1:2, or In:Ga:Zn=2:1:3, or any of oxides whose composition is in the neighborhood of the above compositions is preferably used.

An oxide semiconductor film which can be used for a semiconductor layer of a transistor may be in a single crystal state or a non-single-crystal state. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

The oxide semiconductor film is preferably a CAAC-OS film.

For example, the oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size of greater than or equal to 1 nm and less than 10 nm, for example.

For example, the oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

The oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

A CAAC-OS film is described below.

In most cases, a crystal part of the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly detected. Thus, in the CAAC-OS film, a reduction in electron mobility, due to the grain boundary, is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added may have low crystallinity.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

There are three methods for forming a CAAC-OS film when the CAAC-OS film is used as the oxide semiconductor film.

The first method is to form an oxide semiconductor film at a temperature higher than or equal to 100° C. and lower than or equal to 600° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

In the case where a CAAC-OS film is deposited by a sputtering method for example, a substrate temperature in the deposition is preferably high. For example, an oxide film is deposited at a substrate heating temperature from 100° C. to 600° C., preferably from 200° C. to 500° C., further preferably from 150° C. to 450° C., whereby a CAAC-OS film can be deposited.

Electric power used in a sputtering method is preferably supplied from a direct-current (DC) source. Note that a radio frequency (RF) power source or an alternating-current (AC) power source can be used. Note that it is difficult to use an RF power source for a sputtering apparatus which is capable of deposition to a large-area substrate. In addition, a DC power source is preferred to an AC power source in the following respect.

In the case where an In—Ga—Zn—O compound target is used as a sputtering target, an In—Ga—Zn—O compound target in which InOx powder, GaOy powder, and ZnOz powder are mixed in the molar ratio of 2:2:1, 8:4:3, 3:1:1, 1:1:1, 4:2:3, 3:1:2, 3:1:4, 1:6:4, 1:6:9, or the like is preferably used, for example. Note that x, y, and z are any positive numbers. Further, a sputtering target may be polycrystalline.

Alternatively, with use of magnetron, the density of a plasma area near a sputtering target can be increased by a magnetic field. For example, in a magnetron sputtering apparatus, a magnetic assembly is located in the back of the sputtering target and a magnetic field is generated in the front of the sputtering target. When sputtering to the sputtering target, the magnetic field traps ionized electrons and secondary electrons generated by the sputtering. The electrons trapped in this way enhance the odds of collision with an inert gas, such as a rare gas, in the deposition chamber, thereby increasing the plasma density. Thus, the deposition rate can be increased without significantly increasing the temperature of an element formation layer.

In the case where a CAAC-OS film is deposited by a sputtering method, for example, impurities (e.g., hydrogen, water, carbon dioxide, and nitrogen) existing in a deposition chamber of a sputtering apparatus is preferably reduced. Further, the concentration of impurities in a deposition gas is preferably reduced. For example, as a deposition gas such as an oxygen gas or an argon gas, a highly purified gas having a dew point of −40° C. or lower, preferably −80° C. or lower, still preferably −100° C. or lower is used, whereby suppressing entry of impurities into a CAAC-OS film.

In the case where a CAAC-OS film is deposited by a sputtering method, it is preferable to suppress plasma damage when the deposition is performed by increasing the oxygen percentage in the deposition gas and optimizing electric power. For example, the oxygen percentage in the deposition gas is preferably 30 vol % or higher, still preferably 100 vol %.

In the case where a CAAC-OS film is deposited by a sputtering method, heat treatment may be performed in addition to the substrate heating when the deposition is performed. By the heat treatment, the impurity concentration in the oxide semiconductor film can be reduced, for example.

The heat treatment is performed at higher than or equal to 350° C. and lower than a strain point of the substrate, or may be performed at higher than or equal to 350° C. and lower than or equal to 450° C. Note that the heat treatment may be performed more than once.

There is no particular limitation on a heat treatment apparatus to be used for the heat treatment, and a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

As described in the above process, an impurity concentration in the oxide semiconductor film is reduced by preventing entry of hydrogen, water, or the like into the film during the deposition. The impurity concentration can be reduced by removing hydrogen, water, or the like contained in the oxide semiconductor film through the heat treatment after the deposition of the oxide semiconductor film. After that, oxygen is supplied to the oxide semiconductor film to repair oxygen defects, thereby highly purifying the oxide semiconductor film. Moreover, oxygen may be added to the oxide semiconductor film.

With the use of the CAAC-OS film in a transistor, change in electric characteristics of the transistor due to irradiation with visible light or ultraviolet light is small. Thus, the transistor has high reliability.

The above is the description of the CAAC-OS film.

After formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. The oxide semiconductor film which is highly purified in such a manner includes extremely few (close to zero) carriers derived from a donor, and the carrier concentration thereof is lower than $1\times10^{17}/cm^3$, lower than $1\times10^{15}/cm^3$, lower than $1\times10^{14}/cm^3$, lower than $1\times10^{13}/cm^3$, lower than $1\times10^{12}/cm^3$, lower than $1\times10^{11}/cm^3$, or lower than $1.45\times10^{10}/cm^3$.

The transistor including the oxide semiconductor film which is highly purified by sufficiently reducing the hydrogen concentration, and in which defect levels in the energy gap due to oxygen vacancies are reduced by sufficiently supplying oxygen can achieve extremely excellent off-state current characteristics. For example, the off-state current (per unit channel width (1 μm) here) at room temperature (25° C.) is less than or equal to 100 yA (1 yA (yoctoampere) is $1\times10^{-24}$ A), desirably less than or equal to 10 yA. In addition, the off-state current (per unit channel width (1 mm), here) at 85° C. is less than or equal to 100 zA (1 zA (zeptoampere) is $1\times10^{-21}$ A), desirably less than or equal to 10 zA. In this manner, the transistor which has extremely excellent off-state current characteristics can be obtained with the use of an i-type (intrinsic) or substantially i-type oxide semiconductor film.

[Structural Example 2 of Display Panel]

In the display panel shown as an example in FIG. 9B, a bottom-gate transistor is used. A light-emitting module provided for a pixel in the display portion has such a structure as to emit light to the first substrate 410 side.

Specifically, the first electrode 421G of the light-emitting element 420G in the light-emitting module 450G also serves as a semi-transmissive and semi-reflective film, and the second electrode 422 also serves as a reflective film. Thus, light emitted from the light-emitting element 420G is extracted from the first substrate 410 through a color filter 428G provided between the first electrode 421G and the first substrate 410. In other words, the light-emitting element 420G in the light-emitting module 450G can be referred to as a bottom-emission light-emitting element.

The color filter 428G is formed over the first substrate 410 over which a transistor 481 is provided. A light-blocking film 429 is formed to surround the color filter 428G.

This embodiment can be combined with any of the other embodiments disclosed in this specification as appropriate.

Embodiment 4

In this embodiment, a structure of a light-emitting element which can be used for the light-emitting module according to one embodiment of the present invention will be described with reference to FIGS. 10A to 10C.

The light-emitting element shown as an example in this embodiment includes a first electrode, a second electrode, and a layer containing a light-emitting organic compound (hereinafter referred to as an EL layer) provided between the first electrode and the second electrode. Note that one of the first electrode and the second electrode functions as an anode, and the other functions as a cathode. The EL layer is provided between the first electrode and the second electrode, and a structure of the EL layer may be appropriately selected in accordance with materials of the first electrode and second electrode.

[Structural Example of Light-Emitting Element]

Figure 10A:
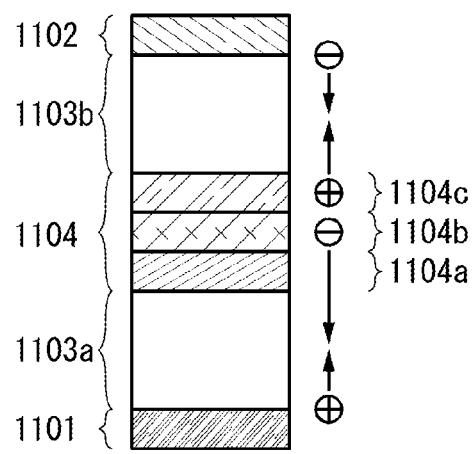
FIGS. 10A to 10C each show a structural example of a light-emitting element according to one embodiment.

An example of a structure of the light-emitting element is illustrated in FIG. 10A. The light-emitting element shown as an example in FIG. 10A includes an EL layer formed of a first light-emitting unit 1103a and a second light-emitting unit 1103b between an anode 1101 and a cathode 1102. Furthermore, an interlayer 1104 is provided between the first light-emitting unit 1103a and the second light-emitting unit 1103b.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

Note that in this specification, a layer or a stacked body which includes one region where electrons and holes injected from both ends are recombined is referred to as a light-emitting unit.

Note that the number of the light-emitting units provided between the anode 1101 and the cathode 1102 is not limited to two. A light-emitting element shown as an example in FIG. 10C has a structure in which a plurality of light-emitting units 1103 are stacked, that is, a so-called tandem structure. Note that in the case where n (n is a natural number greater than or equal to 2) light-emitting units 1103 are provided between the anode and the cathode, the interlayer 1104 is provided between an m-th (m is a natural number greater than or equal to 1 and less than or equal to n−1) light-emitting unit and an (m+1)-th light-emitting unit.

A light-emitting unit 1103 includes at least a light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

Figure 10B:
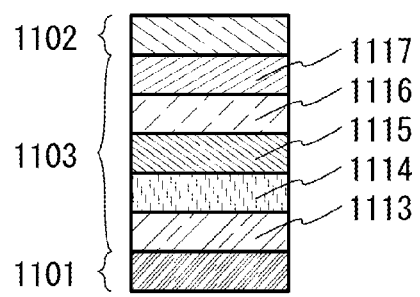
Figure 10C:
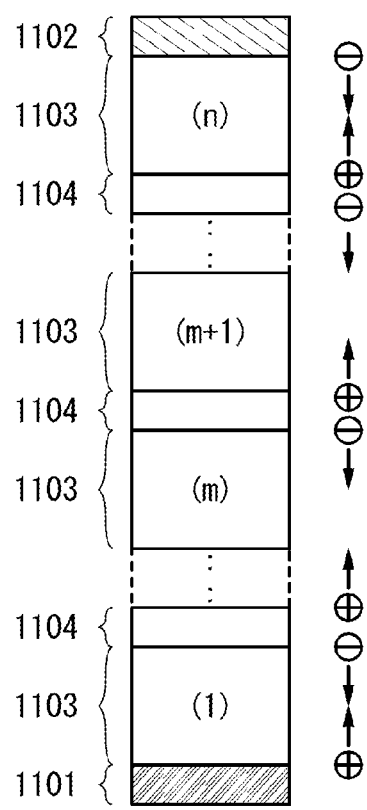

An example of a specific structure of the light-emitting unit 1103 is illustrated in FIG. 10B. In the light-emitting unit 1103 illustrated in FIG. 10B, a hole-injection layer 1113, a hole-transport layer 1114, a light-emitting layer 1115, an electron-transport layer 1116, and an electron-injection layer 1117 are stacked in this order from the anode 1101 side.

A specific example of a structure of the interlayer 1104 is illustrated in FIG. 10A. The interlayer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer layer 1104a are stacked in this order from the cathode 1102 side.

The behaviors of electrons and holes in the interlayer 1104 are described. When a voltage higher than the threshold voltage of the light-emitting element is applied between the anode 1101 and the cathode 1102, in the first charge generation region 1104c, holes and electrons are generated, and the holes move into the light-emitting unit 1103b on the cathode 1102 side and the electrons move into the electron-relay layer 1104b.

The electron-relay layer 1104b has a high electron-transport property and immediately transfers the electrons generated in the first charge generation region 1104c to the electron-injection buffer layer 1104a. The electron-injection buffer layer 1104a can reduce a barrier against electron injection into the light-emitting unit 1103, so that the efficiency of the electron injection into the light-emitting unit 1103 is increased. Thus, the electrons generated in the first charge generation region 1104c are injected into the LUMO level of the light-emitting unit 1103 through the electron-relay layer 1104b and the electron-injection buffer layer 1104a.

In addition, the electron-relay layer 1104b can prevent interaction in which the substance included in the first charge generation region 1104c and the substance included in the electron-injection buffer layer 1104a react with each other at the interface thereof and the functions of the first charge generation region 1104c and the electron-injection buffer layer 1104a are damaged.

The holes injected into the light-emitting unit 1103b provided on the cathode side are recombined with the electrons injected from the cathode 1102, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the interlayer 1104 cause light emission in the respective light-emitting units.

Note that the light-emitting units can be provided in contact with each other when these light-emitting units allow the same structure as the interlayer to be formed therebetween. Specifically, when one surface of the light-emitting unit is provided with a charge generation region, the charge generation region functions as a first charge generation region of the interlayer; thus, the light-emitting units can be provided in contact with each other.

Note that an interlayer can be provided between the cathode and the n-th light-emitting unit.

[Material for Light-Emitting Element]

Next, specific materials that can be used for the light-emitting element having the above-described structure are described. Materials for the anode, the cathode, the EL layer, the charge generation region, the electron-relay layer, and the electron-injection buffer layer are described in this order.

[Material for Anode]

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), indium oxide containing tungsten oxide and zinc oxide, and the like are given.

Besides, as a material used for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be subsequently described together with a material for forming the first charge generation region.

[Material for Cathode]

As a material of the cathode 1102, a material having a low work function (specifically, a work function of lower than 4.0 eV) is preferably used; however, in the case where the first charge generation region is provided between the cathode 1102 and the light-emitting unit 1103 to be in contact with the cathode 1102, various conductive materials can be used for the cathode 1102 regardless of their work functions.

Note that at least one of the cathode 1102 and the anode 1101 is formed using a conductive film that transmits visible light. For the conductive film that transmits visible light, for example, a film of indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness small enough to transmit light (preferably, approximately 5 nm to 30 nm) can also be used.

[Material for EL Layer]

Specific examples of materials for the layers included in the light-emitting unit 1103 will be given below.

[Hole-Injection Layer]

The hole-injection layer contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: H$_2$Pc) or copper phthalocyanine (abbreviation: CuPc), a polymer such as poly(3,4-ethylenedioxythiophene)/poly(styrenesulfonate) (PEDOT/PSS), or the like to form the hole-injection layer.

Note that the second charge generation region may be used instead of the hole-injection layer. When the second charge generation region is used, a variety of conductive materials can be used for the anode 1101 regardless of their work functions as described above. A material for forming the second charge generation region will be subsequently described together with a material for forming the first charge generation region.

[Hole-Transport Layer]

The hole-transport layer contains a substance having a high hole-transport property. The hole-transport layer is not limited to a single layer, but may be a stack of two or more layers each containing a substance having a high hole-transport property. The hole-transport layer contains any substance having a higher hole-transport property than an electron-transport property, and preferably contains a substance having a hole mobility of $10^{-6}$ cm$^2$/V·s or higher because the driving voltage of the light-emitting element can be reduced.

[Light-Emitting Layer]

The light-emitting layer contains a light-emitting substance. The light-emitting layer is not limited to a single layer, but may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

The light-emitting substance is preferably dispersed in a host material. A host material preferably has higher excitation energy than the light-emitting substance.

[Electron-Transport Layer]

The electron-transport layer contains a substance having a high electron-transport property. The electron-transport layer is not limited to a single layer, but may be a stack of two or more layers each containing a substance having a high electron-transport property. The electron-transport layer contains any substance having a higher electron-transport property than a hole-transport property, and preferably contains a substance having an electron mobility of $10^{-6}$ cm$^2$/V·s or higher because the driving voltage of the light-emitting element can be reduced.

[Electron-Injection Layer]

The electron-injection layer contains a substance having a high electron-injection property. The electron-injection layer is not limited to a single layer, but may be a stack of two or more layers each containing a substance having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

[Material for Charge Generation Region]

The first charge generation region 1104c and the second charge generation region are regions containing a substance having a high hole-transport property and an acceptor substance. Note that the charge generation region is not limited to the structure in which one film contains the substance having a high hole-transport property and the acceptor substance, and may be a stacked layer of a layer containing the substance having a high hole-transport property and a layer containing the acceptor substance. Note that in the case where the first charge generation region which is in contact with the cathode has a stacked-layer structure, the layer containing the substance having a high hole-transport property is in contact with the cathode 1102. In the case where the second charge generation region which is in contact with the anode has a stacked-layer structure, the layer containing the acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide, particularly an oxide of a metal belonging to Group 4 to 8 of the periodic table is preferable. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of $10^{-6}$ cm$^2$/V·s or higher is preferably used. However, any substance other than the above described materials may also be used as long as the substance has a higher hole-transport property than an electron-transport property.

[Material for Electron-Relay Layer]

The electron-relay layer 1104b can immediately receive electrons drawn out by the acceptor substance in the first charge generation region 1104c. Therefore, the electron-relay layer 1104b contains a substance having a high electron-transport property, and the LUMO level thereof is positioned between the acceptor level of the acceptor substance in the first charge generation region 1104c and the LUMO level of the light-emitting unit 1103. Specifically, the LUMO level of the electron-relay layer 1104b is preferably about from −5.0 eV to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or fluorine is preferably used because such a compound further facilitates acceptance of electrons in the electron-relay layer 1104b.

[Material for Electron-Injection Buffer Layer]

The electron-injection buffer layer 1104a facilitates electron injection from the first charge generation region 1104c into the light-emitting unit 1103. By providing the electron-injection buffer layer 1104a between the first charge generation region 1104c and the light-emitting unit 1103, the injection barrier therebetween can be reduced.

A substance having a high electron-injection property can be used for the electron-injection buffer layer 1104a. For example, an alkali metal, an alkaline earth metal, a rare earth metal, or a compound thereof (e.g., an alkali metal compound (including an oxide such as lithium oxide, a halide, and carbonate such as lithium carbonate or cesium carbonate), an alkaline earth metal compound (including an oxide, a halide, and carbonate), or a rare earth metal compound (including an oxide, a halide, and carbonate)) can be used.

Further, in the case where the electron-injection buffer layer 1104a contains a substance having a high electron-transport property and a donor substance with respect to the substance having a high electron-transport property, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-transport property, a material similar to the above material for the electron-transport layer which can be formed in part of the light-emitting unit 1103 can be used.

[Method for Manufacturing Light-Emitting Element]

A method for manufacturing the light-emitting element will be described. Over the first electrode, the layers described above are combined as appropriate to form an EL layer. Any of a variety of methods (e.g., a dry process or a wet process) can be used for the EL layer depending on the material for the EL layer. For example, a vacuum evaporation method, an inkjet method, a spin coating method, or the like may be selected. Note that a different method may be employed for each layer. The second electrode is formed over the EL layer, so that the light-emitting element is manufactured.

The light-emitting element described in this embodiment can be fabricated by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a structure may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

This embodiment can be combined with any of the other embodiments disclosed in this specification as appropriate.

Embodiment 5

In this embodiment, electronic devices according to embodiments of the present invention will be described. Specifically, electronic devices on each of which the display device shown as an example any of Embodiments 1 to 4 is mounted will be described with reference to FIGS. 11A to 11E.

Examples of such an electronic device for which a display device according to one embodiment of the present invention is used include the following: television sets (also called TV or television receivers); monitors for computers or the like;

cameras such as digital cameras or digital video cameras; digital photo frames; mobile phones (also called cellular phones or portable telephones); portable game machines; portable information terminals; audio playback devices; and large game machines such as pachinko machines. Specific examples of these electronic devices are shown in FIGS. 11A to 11E.

Figure 11A:
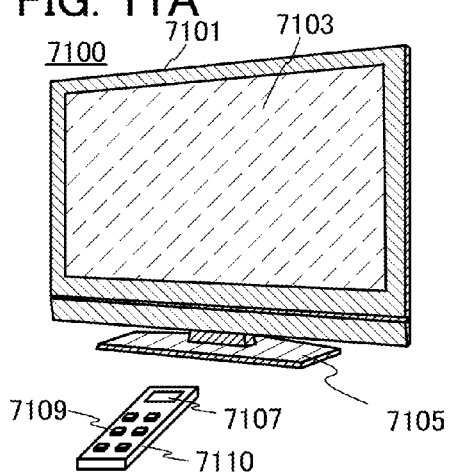
FIGS. 11A to 11E each show a structural example of an electronic device including a display device according to one embodiment.

FIG. 11A shows an example of a television set. In a television set 7100, a display portion 7103 is incorporated in a housing 7101. Images can be displayed on the display portion 7103. In addition, here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set 7100 is provided with a receiver, a modem, and the like. Moreover, when the display device is connected to a communication network with or without wires via the modem, one-way (from a sender to a receiver) or two-way (between a sender and a receiver or between receivers) information communication can be performed.

Figure 11B:
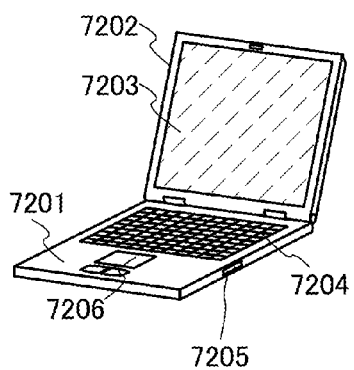

FIG. 11B shows a computer that includes a main body 7201, a housing 7202, a display portion 7203, a keyboard 7204, an external connection port 7205, a pointing device 7206, and the like. The display device of one embodiment of the present invention is used for the display portion 7203 in this computer.

Figure 11C:
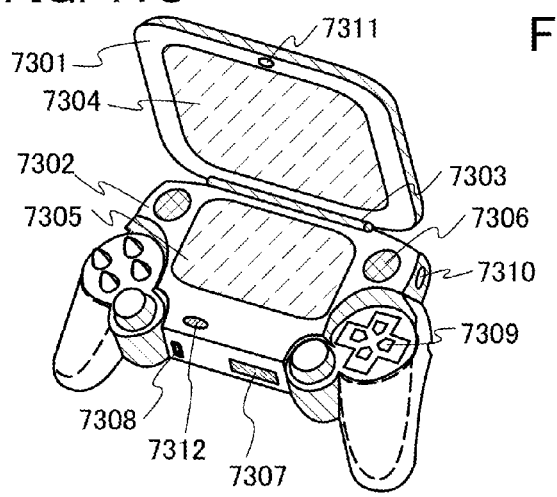

FIG. 11C shows a portable game machine that includes two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 11C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. It is needless to say that the structure of the portable game machine is not limited to the above as long as the display device of one embodiment of the present invention is used for at least either the display portion 7304 or the display portion 7305, or both, and can include other accessories arbitrarily. The portable game machine illustrated in FIG. 11C has a function of reading a program or data stored in a recording medium to display it on the display portion, and a function of sharing information with another portable game machine by wireless communication. The portable game machine in FIG. 11C can have a variety of functions without limitation to the above functions.

Figure 11D:
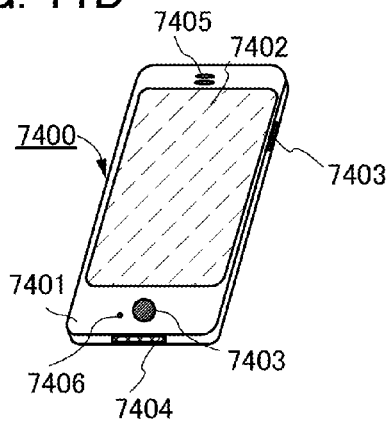

FIG. 11D shows an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured by using the display device of one embodiment of the present invention for the display portion 7402.

When the display portion 7402 is touched with a finger or the like, data can be input into the mobile phone 7400 in FIG. 11D. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating e-mail, a text input mode mainly for inputting text is selected for the display portion 7402 so that text displayed on a screen can be input. In this case, it is preferable to display a keyboard or number buttons on almost all the area of the screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 11E:
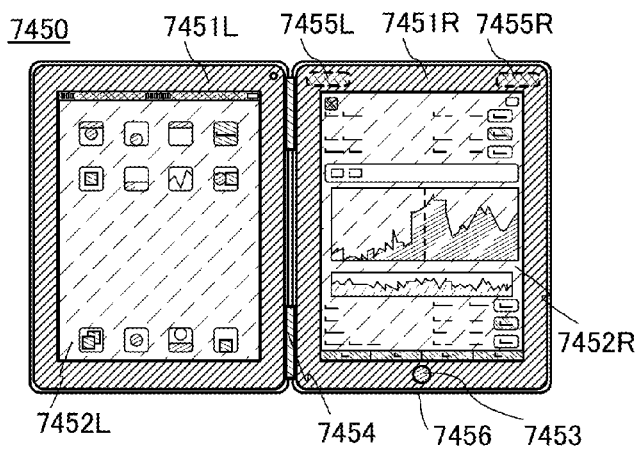

FIG. 11E shows an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. When the hinge 7454 is folded so that a display portion 7452L provided in the housing 7451L and a display portion 7452R provided in the housing 7451R face each other, the display portions can be protected by the housings.

Each of the display portions 7452L and 7452R is a component which can display images and to which information can be input by touch with a finger or the like. For example, an icon for an installed program is selected by touch with a finger so that the program can be started. Further, changing the distance between fingers touching two positions of a displayed image enables zooming in or out on the image. Drag of a finger touching one position of the displayed image enables drag and drop of the image. Selection of a displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic device connected to the network from a distant place. The display device of one embodiment of the present invention is used for the display portion 7452L and the display portion 7452R in the folding computer 7450.

This embodiment can be combined with any of the other embodiments disclosed in this specification as appropriate.

This application is based on Japanese Patent Application Serial No. 2012-107937 filed with Japan Patent Office on May 9, 2012, the entire contents of which are hereby incorporated by reference.

What is claimed is:

1. A display device comprising:
a display portion in which pixels are provided at a resolution of greater than or equal to 80 ppi, the pixels each comprising a light-emitting module capable of emitting light with a spectral line half-width of less than or equal to 60 nm in a response time of shorter than or equal to 100 μs,
wherein the display device has an NTSC ratio of higher than or equal to 80% and a contrast ratio of higher than or equal to 500, and
wherein a transient characteristic of emission intensity of the light-emitting module has a projecting portion in a portion rising in response to an input signal, the projecting portion having a higher emission intensity than other portions of the transient characteristic.

2. The display device according to claim 1,
wherein the light-emitting module comprises:
a reflective film;
a semi-transmissive and semi-reflective film; and
a light-emitting element between the reflective film and the semi-transmissive and semi-reflective film, the light-emitting element comprising:
a pair of electrodes; and
a layer comprising a light-emitting organic compound between the pair of electrodes.

3. The display device according to claim 1,
wherein the light-emitting module comprises:
a reflective film;
a semi-transmissive and semi-reflective film;
a light-emitting element between the reflective film and the semi-transmissive and semi-reflective film, the light-emitting element comprising:
a pair of electrodes;
a plurality of layers each comprising a light-emitting organic compound between the pair of electrodes; and
an interlayer between one of the plurality of layers and another of the plurality of layers; and
a color filter overlapping with the light-emitting element with the semi-transmissive and semi-reflective film provided therebetween.

4. The display device according to claim 3, comprising:
a first light-emitting module comprising:
a color filter transmitting red light; and
the reflective film and the semi-transmissive and semi-reflective film between which an optical path length is adjusted to i/2 times (i is a natural number) a length greater than or equal to 600 nm and less than 800 nm;
a second light-emitting module comprising:
a color filter transmitting green light; and
the reflective film and the semi-transmissive and semi-reflective film between which an optical path length is adjusted to j/2 times (j is a natural number) a length greater than or equal to 500 nm and less than 600 nm; and
a third light-emitting module comprising:
a color filter transmitting blue light; and
the reflective film and the semi-transmissive and semi-reflective film between which an optical path length is adjusted to k/2 times (k is a natural number) a length greater than or equal to 400 nm and less than 500 nm.

5. The display device according to claim 3, comprising:
a first light-emitting module comprising:
a color filter transmitting red light; and
the reflective film and the semi-transmissive and semi-reflective film between which an optical path length is adjusted to i/2 times (i is a natural number) a length greater than or equal to 600 nm and less than 800 nm;
a second light-emitting module comprising:
a color filter transmitting green light; and
the reflective film and the semi-transmissive and semi-reflective film between which an optical path length is adjusted to j/2 times (j is a natural number) a length greater than or equal to 500 nm and less than 600 nm; and
a third light-emitting module comprising:
a color filter transmitting blue light; and
the reflective film and the semi-transmissive and semi-reflective film between which an optical path length is adjusted to k/2 times (k is a natural number) a length greater than or equal to 400 nm and less than 500 nm,
wherein the first light-emitting module, the second light-emitting module, and the third light-emitting module comprise a layer comprising a same light-emitting organic compound.

6. The display device according to claim 1, comprising:
a first light-emitting module configured to emit red light with a spectral line half-width of less than 50 nm;
a second light-emitting module configured to emit green light with a spectral line half-width of less than the spectral line half-width of the red light; and
a third light-emitting module configured to emit blue light with a spectral line half-width of less than the spectral line half-width of the green light.

7. An electronic device comprising the display device according to claim 1.

8. A display device comprising:
a display portion in which pixels are provided at a resolution of greater than or equal to 80 ppi, the pixels each comprising a light-emitting module capable of emitting light with a spectral line half-width of less than or equal to 60 nm in a response time of shorter than or equal to 100 μs; and
a correction control circuit configured to generate a signal that corrects a transient characteristic of emission intensity of the light-emitting module and to output the signal to the display portion, wherein the display device has an NTSC ratio of higher than or equal to 80% and a contrast ratio of higher than or equal to 500, and wherein the transient characteristic of emission intensity of the light-emitting module has a projecting portion in a portion rising in response to an input signal, the projecting portion having a higher emission intensity than other portions of the transient characteristic.

9. The display device according to claim 8,
wherein the light-emitting module comprises:
 a reflective film;
 a semi-transmissive and semi-reflective film; and
 a light-emitting element between the reflective film and the semi-transmissive and semi-reflective film, the light-emitting element comprising:
  a pair of electrodes; and
  a layer comprising a light-emitting organic compound between the pair of electrodes.

10. The display device according to claim 8,
wherein the light-emitting module comprises:
 a reflective film;
 a semi-transmissive and semi-reflective film;
 a light-emitting element between the reflective film and the semi-transmissive and semi-reflective film, the light-emitting element comprising:
  a pair of electrodes;
  a plurality of layers each comprising a light-emitting organic compound between the pair of electrodes; and
  an interlayer between one of the plurality of layers and another of the plurality of layers; and
 a color filter overlapping with the light-emitting element with the semi-transmissive and semi-reflective film provided therebetween.

11. The display device according to claim 10, comprising:
a first light-emitting module comprising:
 a color filter transmitting red light; and
 the reflective film and the semi-transmissive and semi-reflective film between which an optical path length is adjusted to i/2 times (i is a natural number) a length greater than or equal to 600 nm and less than 800 nm;
a second light-emitting module comprising:
 a color filter transmitting green light; and
 the reflective film and the semi-transmissive and semi-reflective film between which an optical path length is adjusted to j/2 times (j is a natural number) a length greater than or equal to 500 nm and less than 600 nm; and
a third light-emitting module comprising:
 a color filter transmitting blue light; and
 the reflective film and the semi-transmissive and semi-reflective film between which an optical path length is adjusted to k/2 times (k is a natural number) a length greater than or equal to 400 nm and less than 500 nm.

12. The display device according to claim 10, comprising:
a first light-emitting module comprising:
 a color filter transmitting red light; and
 the reflective film and the semi-transmissive and semi-reflective film between which an optical path length is adjusted to i/2 times (i is a natural number) a length greater than or equal to 600 nm and less than 800 nm;
a second light-emitting module comprising:
 a color filter transmitting green light; and
 the reflective film and the semi-transmissive and semi-reflective film between which an optical path length is adjusted to j/2 times (j is a natural number) a length greater than or equal to 500 nm and less than 600 nm; and
a third light-emitting module comprising:
 a color filter transmitting blue light; and
 the reflective film and the semi-transmissive and semi-reflective film between which an optical path length is adjusted to k/2 times (k is a natural number) a length greater than or equal to 400 nm and less than 500 nm,
wherein the first light-emitting module, the second light-emitting module, and the third light-emitting module comprise a layer comprising a same light-emitting organic compound.

13. The display device according to claim 8, comprising:
a first light-emitting module configured to emit red light with a spectral line half-width of less than 50 nm;
a second light-emitting module configured to emit green light with a spectral line half-width of less than the spectral line half-width of the red light; and
a third light-emitting module configured to emit blue light with a spectral line half-width of less than the spectral line half-width of the green light.

14. An electronic device comprising the display device according to claim 8.

15. A display device comprising:
a display portion in which pixels are provided at a resolution of greater than or equal to 80 ppi, the pixels each comprising a light-emitting module capable of emitting light with a spectral line half-width of less than or equal to 60 nm in a response time of shorter than or equal to 100 μs,
wherein the display device has an NTSC ratio of higher than or equal to 80% and a contrast ratio of higher than or equal to 500, and
wherein a transient characteristic of emission intensity of the light-emitting module has a projecting portion and a second portion following the projecting portion, the projecting portion having a higher emission intensity than the second portion.

16. The display device according to claim 15, wherein the light emitting module comprising:
 a pair of electrodes; and
 a layer comprising a light-emitting organic compound between the pair of electrodes.

17. The display device according to claim 16, wherein the light-emitting organic compound is one of a fluorescent organic compound and a phosphorescent organic compound.

18. An electronic device comprising the display device according to claim 15.

* * * * *